(12) United States Patent
Padmanaban et al.

(10) Patent No.: US 7,122,291 B2
(45) Date of Patent: Oct. 17, 2006

(54) PHOTORESIST COMPOSITIONS

(75) Inventors: Munirathna Padmanaban, Bridgewater, NJ (US); Guanyang Lin, Bridgewater, NJ (US); Takanori Kudo, Bedminster, NJ (US); Chi-Sun Hong, Princeton, NJ (US); M. Dalil Rahman, Flemington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/909,513

(22) Filed: Aug. 2, 2004

(65) Prior Publication Data

US 2006/0024610 A1   Feb. 2, 2006

(51) Int. Cl.
   G03C 1/73   (2006.01)
   G03F 7/39   (2006.01)
   G03F 7/20   (2006.01)
   G03F 7/30   (2006.01)
   C08L 37/00  (2006.01)

(52) U.S. Cl. .................. 430/270.1; 430/325; 430/326; 430/330; 430/311; 430/910; 525/206; 525/210; 526/270; 526/282

(58) Field of Classification Search ............ 430/270.1, 430/905, 910, 326, 330, 311
See application file for complete search history.

(56) References Cited

U.S. PATENT DOCUMENTS 6,706,826 B1   3/2004   Fujiwara et al. ............. 526/79

2003/0235775 A1*   12/2003   Padmanaban et al. ... 430/270.1
2004/0161697 A2*   8/2004    Kodama et al. .......... 430/270.1
2005/0147915 A1*   7/2005    Dammel .................. 430/270.1

FOREIGN PATENT DOCUMENTS

EP   1296190 A1 *   3/2003
JP   2003-43690      2/2003
JP   2003-122007     4/2003

OTHER PUBLICATIONS

English language abstract (from Japan Patent Office) of JP2003-122007.
Kamon et al., "Newly developed acrylic copolymers for ArF photoresist", Proceedings of SPIE, vol. 4690, pp. 475-482 (2002).
Otake et al., "Design and Development of Novel Monomers and Copolymers for 193-nm Lithography", J. Photopolymer Sci. and Tech., vol. 17, No. 4, pp. 475-482 (2004).
Otake et al., "Design and Development of Novel Monomers and Copolymers for 193-nm Lithography", Microlithography, Feb. 23-24, 2004.
Invitation to Pay Additional Fees (Form PCT/ISA/206) for PCT/IB2005/002844.
Derwent Abstract of JP 2003-43690.
Machine-assisted English translation of JP 2003-43690, provided by JPO.*
Copy of Communication (Form PCT/ISA/224) and of Written Opinion of the International Searching Authority (Form PCT/ISA/237) in corresponding PCT International Application No. PCT/IB2005/002844.

* cited by examiner

Primary Examiner—Sin Lee
(74) Attorney, Agent, or Firm—Alan P. Kass

(57) ABSTRACT

The present invention provides for a photoresist composition comprising a mixture of two different copolymers.

12 Claims, No Drawings

PHOTORESIST COMPOSITIONS

FIELD OF INVENTION

The present invention relates to a composition which comprises a mixture of polymers where one polymer contains a α-gamma butyrolactone methacrylate monomer unit and another polymer contains a β-gamma butyrolactone methacrylate monomer unit. The resulting photoresist composition provides both good photosensitivity and also significantly reduces edge roughness of the imaged photoresist profiles. Such a composition is especially useful for exposure at 193 nanometers (nm), both dry and immersion, and 157 nm. The invention further relates to a process for imaging the novel photoresist composition. The invention also relates to other photoresist compositions.

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist. The trend toward the miniaturization of semiconductor devices has led to the use of new photoresists that are sensitive at lower and lower wavelengths of radiation and has also led to the use of sophisticated multilevel systems to overcome difficulties associated with such miniaturization.

There are two types of photoresist compositions: negative-working and positive-working. The type of photoresist used at a particular point in lithographic processing is determined by the design of the semiconductor device. When negative-working photoresist compositions are exposed image-wise to radiation, the areas of the photoresist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature, which the resist composition can transfer from the photomask to the substrate with a high degree of image edge acuity after exposure and development. In many leading edge manufacturing applications today, photoresist resolution on the order of less than one-half micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices. In cases where the photoresist dimensions have been reduced to below 150 nanometers (nm), the roughness of the photoresist patterns has become a critical issue. Edge roughness, commonly known as line edge roughness, is typically observed for line and space patterns as roughness along the photoresist line, and for contact holes as side wall roughness. Edge roughness can have adverse effects on the lithographic performance of the photoresist, especially in reducing the critical dimension latitude and also in transferring the line edge roughness of the photoresist to the substrate. Hence, photoresists that minimize edge roughness are highly desirable.

Photoresists sensitive to short wavelengths, between about 100 nm and about 300 nm are often used where subhalfmicron geometries are required.

High resolution, chemically amplified, deep ultraviolet (100–300 nm) positive and negative tone photoresists are available for patterning images with less than quarter micron geometries. To date, there are three major deep ultraviolet (UV) exposure technologies that have provided significant advancement in miniaturization, and these use lasers that emit radiation at 248 nm, 193 nm (dry and immersion) and 157 nm. Photoresists used in the deep UV typically comprise a polymer which has an acid labile group and which can deprotect in the presence of an acid, a photoactive component which generates an acid upon absorption of light, and a solvent.

Photoresists for 248 nm have typically been based on substituted polyhydroxystyrene and its copolymers, such as those described in U.S. Pat. Nos. 4,491,628 and 5,350,660. On the other hand, photoresists for 193 nm exposure require non-aromatic polymers, since aromatics are opaque at this wavelength. U.S. Pat. No. 5,843,624 and GB 2,320,718 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon:hydrogen ratios which improve etch resistance, they also provide transparency at low wavelengths and they have relatively high glass transition temperatures. Photoresists sensitive at 157 nm have been based on fluorinated polymers, which are known to be substantially transparent at that wavelength. Photoresists derived from polymers containing fluorinated groups are described in WO 00/67072 and WO 00/17712.

The present invention pertains to an additive useful in photoresist compositions. The composition is particularly useful for imaging in the range of 100–300 nm, for example 157 nm and 193 nm (dry and immersion).

SUMMARY OF THE INVENTION

The present invention relates to a photoresist composition comprising a polymer mixture comprising a copolymer (A) containing a α-gamma-butyrolactone methacrylate monomer unit and a copolymer (B) containing a β-gamma-butyrolactone methacrylate monomer unit.

Each or both copolymer (A) and (B) can further contain monomers that have an acid labile group, for example an alicyclic moiety, a cycloolefin monomer, a cyclic anhydride and/or a monomer having the formula

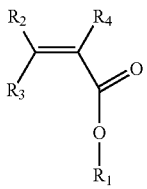

where $R_1$ is —Y—Z where Y is a linear or branched alkylene or a monocyclic or polycyclic alkylene, Z is unsubstituted or substituted monocyclic or polycyclic hydrocarbon lactone; $R_2$, $R_3$, and $R_4$ are each independently selected from hydrogen, alkyl, alkoxyalkyl, cycloalkyl, cycloalkenyl, aryl, aralkyl, and CN.

The photoresist composition comprises copolymers (A) and (B) are present in a ratio of (A):(B) of from about 90:10 weight percent to about 10:90 weight percent, further from about 70:30 weight percent (A):(B) to about 30:70 weight percent (A):(B), and further from about 70:30 weight percent (A):(B) to about 50:50 weight percent (A):(B).

The present invention also relates to a photoresist composition comprising a polymer mixture comprising a copolymer (A) containing a α-gamma-butyrolactone methacrylate monomer unit and a copolymer (B) containing a β-gamma-butyrolactone methacrylate monomer unit wherein the ratio of copolymers (A) and (B) is from about 90:10 weight percent to about 10:90 weight percent, further from about 70:30 weight percent (A):(B) to about 30:70 weight percent (A):(B), and further from about 70:30 weight percent (A):(B) to about 50:50 weight percent (A):(B).

Each or both copolymer (A) and (B) can further contain monomers that have an acid labile group, for example an alicyclic moiety, a cycloolefin monomer, a cyclic anhydride and/or a monomer having the formula

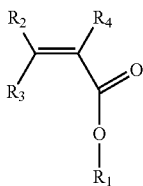

where $R_1$ is —Y—Z where Y is a linear or branched alkylene or a monocyclic or polycyclic alkylene, Z is unsubstituted or substituted monocyclic or polycyclic hydrocarbon lactone; $R_2$, $R_3$, and $R_4$ are each independently selected from hydrogen, alkyl, alkoxyalkyl, cycloalkyl, cycloalkenyl, aryl, aralkyl, and CN.

The present invention also relates to a process for imaging a photoresist comprising coating a substrate with the above compositions, baking the substrate to substantially remove the solvent, image-wise exposing the photoresist coating, post-exposure baking the photoresist coating, and developing the photoresist coating with an aqueous alkaline solution.

The present invention also relates to a method for producing a microelectronic device by forming an image on a substrate comprising providing the above photoresist compositions, coating a suitable substrate with the photoresist composition, heat treating the coated substrate until substantially all the photoresist solvent is removed, image-wise exposing the photoresist composition and removing the image-wise exposed areas of the composition with a suitable developer.

The invention also relates to a photoresist composition which comprises a polymer selected from the group consisting of poly(2-methyl-2-adamantyl methacrylate-co-α-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-α-gamma-butyrolactone methacrylate-co-2-cyano-5-norbornyl methacrylate); poly(2-ethyl-2-adamantyl methacrylate-co-β-gamma-butyrolactone methacrylate-co-2-cyano-5-norbornyl methacrylate); poly(2-ethyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-2-ethyl-2-adamantyl methacrylate-co-2-cyano-5-norbornyl methacrylate); poly(2-methyl-2-adamantyl methacrylate-co-3-hydroxy-1-methacryloxyadamantane-co-2-cyano-5-norbornyl methacrylate); poly(t-butyl norbornene carboxylate-co-maleic anhydride-co-2-methyl-2-adamantyl methacrylate-co-β-gamma-butyrolactone methacrylate-co-2-cyano-5-norbornyl methacrylate); poly(t-butyl norbornene carboxylateco-maleic anhydride-co-2-methyl-2-adamantyl methacrylate-co-2-cyano-5-norbornyl methacrylate-co-5-methacryloyloxy-2,6-norbornanecarbolactone); poly(2-methyl-2-adamantyl methacrylate-co-5-methacryloyloxy-2,6-norbornanecarbolactone-co-2-cyano-5-norbornyl methacrylate); poly(2-methyl-2-adamantyl methacrylate-co-2-ethyl-2-adamantyl methacrylate-co-4-isopropyl-1-methyl-5-methacryloyloxy-2,6-bicyclo[2.2.2]octanecarbolactone); poly(2-methyl-2-adamantyl methacrylate-co-3-hydroxy-1-methacryloxyadamantane-co-4-isopropyl-1-methyl-5-methacryloyloxy-2,6-[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloyloxy-2,6-norbornanecarbolactone); poly(2-methyl-2-adamantyl methacrylate-co-5-methacryloyloxy-2,6-norbornanecarbolactone-co-4-isopropyl-1-methyl-5-methacryloyloxy-2,6bicyclo[2.2.2]octanecarolactone); poly(2-methyl-2-adamantyl methacrylate-co-2-ethyl-2-adamantyl methacrylate-co-4-isopropyl-1-methyl-5-methoxy-6-methacryloyloxy-3,2-bicyclo[2.2.2]octanecarbolactone); poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(t-buty norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone-co-5methacryloyloxy-2,6-norbornanecarbolactone); poly(β-gamma-butyrolactone methacrylate-co-2-ethyl-2-adamantyl methacrylate-co-3-hydroxy-1-methacryloxyadamatane); poly(α-gamma-butyrolactone methacrylate-co-1-ethyl-1-cyclopentylmethacrylate-co-2-cyano-5-norbornyl methacrylate); poly(β-gamma-butyrolactone methacrylate-co-1-ethyl-1-cyclopentylmethacrylate-co-2-cyano-5-norbornyl methacrylate); poly(α-gamma-butyrolactone methacrylate-co-2-ethyl-2-adamantyl methacrylate-co-1-ethyl-1-cyclopentylmethacrylate-co-2-cyano-5-norbornyl methacrylate); poly(β-gamma-butyrolactone methacrylate-co-2-ethyl-2-adamantyl methacrylate-co-1-ethyl-1-cyclopentylmethacrylate-co-2-cyano-5-norbornyl methacrylate); poly(α-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); and poly(2-methyl-2-adamantyl methacrylate-co-5-methacryloyloxy-2,6-norbornanecarbolactone-co-4-isopropyl-1-methyl-5-methoxy-6-methacryloyloxy-3,2-bicyclo[2.2.2]octanecarbolactone). A further embodiment includes a photoresist composition where the polymer is selected from the group consisting of poly(2-methyl-2-adamantyl methacrylate-co-α-gamma-butyrolactone methacrylate-co-β-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-α-gamma-butyrolactone methacrylate-co-2-cyano-5-norbornyl methacrylate); poly(2-ethyl-2-adamantyl methacrylate-co-β-gamma-butyrolactone methacrylate-co-2-cyano-5-norbornyl methacrylate); poly(2-ethyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-2-ethyl-2-adamantyl methacrylate-co-2-cyano-5-norbornyl methacrylate); poly(2-methyl-2-adamantyl methacrylate-co-3-hydroxy-1-methacryloxyadamantane-co-2-cyano-5-norbornyl methacrylate); poly(t-butyl norbornene carboxylate-co-maleic anhydride-co-2-methyl-2-adamantyl methacrylate-co-β-gamma-butyrolactone methacrylate-co-2-cyano-5-norbornyl methacrylate); poly(t-butyl norbornene carboxylate-co-maleic anhydride-co-2-methyl-2-adamantyl methacrylate-co-2-cyano-5-norbornyl methacrylate-co-5-methacryloyloxy-2,6-norbornanecarbolactone); poly(2-methyl-2-adamantyl methacrylate-co-5-methacryloyloxy-2,6-norbornanecarbolactone-co-2-cyano-5-norbornyl methacrylate); poly(2-methyl-2-adamantyl methacrylate-co-2-ethyl-2-adamantyl methacrylate-co-4-isopropyl-1-methyl-5-methacryloyloxy-2,6-bicyclo[2.2.2]octanecarbolactone); poly(2-methyl-2-adamantyl methacrylate-co-3-hydroxy-1-methacryloxyadamantane-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloyloxy-2,6-norbornanecarbolactone); poly(2-methyl-2-adamantyl methacrylate-co-5-methacryloyloxy-2,6-norbornanecarbolactone-co-4-isopropyl-1-methyl-5-methacryloyloxy-2,6-bicyclo[2.2.2]octanecarbolactone); poly(2-methyl-2-adamantyl methacrylate-co-2-ethyl-2-adamantyl methacrylate-co-4-isopropyl-1-methyl-5-methoxy-6-methacryloyloxy-3,2-bicyclo[2.2.2]octanecarbolactone); poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone-co-5-methacryloyloxy-2,6-norbornanecarbolactone); poly(β-gamma-butyrolactone methacrylate-co-2-ethyl-2-adamantyl methacrylate-co-3-hydroxy-1-methacryloxyadamatane); poly(α-gamma-butyrolactone methacrylate-co-1-ethyl-1-cyclopentylmethacrylate-co-2-cyano-5-norbornyl methacrylate); poly(β-gamma-butyrolactone methacrylate-co-1-ethyl-1-cyclopentylmethacrylate-co-2-cyano-5-norbornyl methacrylate); poly(α-gamma-butyrolactone methacrylate-co-2-ethyl-2-adamantyl methacrylate-co-1-ethyl-1-cyclopentylmethacrylate-co-2-cyano-5-norbornyl methacrylate); poly(β-gamma-butyrolactone methacrylate-co-2-ethyl-2-adamantyl methacrylate-co-1-ethyl-1-cyclopentylmethacrylate-co-2-cyano-5-norbornyl methacrylate); poly(α-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); and poly(2-methyl-2-adamantyl methacrylate-co-5-methacryloyloxy-2,6-norbornanecarbolactone-co-4-isopropyl-1-methyl-5-methoxy-6-methacryloyloxy-3,2-bicyclo[2.2.2]octanecarbolactone). These photoresist compositions can also be used in a process for imaging a photoresist comprising coating a substrate with one of these photoresist compositions, baking the substrate to substantially remove the solvent, image-wise exposing the photoresist coating, post-exposure baking the photoresist coating, and developing the photoresist coating with an aqueous alkaline solution. Additionally, these photoresist compositions can be used to produce a microelectronic device by forming an image on a substrate comprising providing one of these photoresist compositions, coating a suitable substrate with the photoresist composition, heat treating the coated substrate until substantially all the photoresist solvent is removed, image-wise exposing the photoresist composition and removing the image-wise exposed areas of the composition with a suitable developer.

DETAILED DESCRIPTION OF THE INVENTION

The present invention relates to a photoresist composition comprising a polymer mixture comprising a copolymer (A) containing a α-gamma-butyrolactone methacrylate monomer unit and a copolymer (B) containing a β-gamma-butyrolactone methacrylate monomer unit.

Each or both copolymer (A) and (B) can further contain monomers that have an acid labile group, for example an alicyclic moiety, a cycloolefin monomer, a cyclic anhydride and/or a monomer having the formula

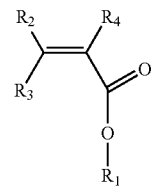

where $R_1$ is —Y—Z where Y is a linear or branched alkylene or a monocyclic or polycyclic alkylene, Z is unsubstituted or substituted monocyclic or polycyclic hydrocarbon lactone; $R_2$, $R_3$, and $R_4$ are each independently selected from hydrogen, alkyl, alkoxyalkyl, cycloalkyl, cycloalkenyl, aryl, aralkyl, and CN.

The photoresist composition comprises copolymers (A) and (B) are present in a ratio of (A):(B) of from about 90:10 weight percent to about 10:90 weight percent, further from about 70:30 weight percent (A):(B) to about 30:70 weight percent (A):(B), and further from about 70:30 weight percent (A):(B) to about 50:50 weight percent (A):(B).

The present invention also relates to a photoresist composition comprising a polymer mixture comprising a copolymer (A) containing a α-gamma-butyrolactone methacrylate monomer unit and a copolymer (B) containing a β-gamma-butyrolactone methacrylate monomer unit wherein the ratio of copolymers (A) and (B) is from about 90:10 weight percent to about 10:90 weight percent, further from about 70:30 weight percent (A):(B) to about 30:70 weight percent (A):(B), and further from about 70:30 weight percent (A):(B) to about 50:50 weight percent (A):(B).

Each or both copolymer (A) and (B) can further contain monomers that have an acid labile group, for example an alicyclic moiety, a cycloolefin monomer, a cyclic anhydride and/or a monomer having the formula

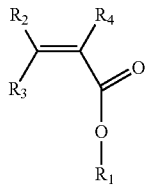

where $R_1$ is —Y—Z where Y is a linear or branched alkylene or a monocyclic or polycyclic alkylene, Z is unsubstituted or substituted monocyclic or polycyclic hydrocarbon lactone; $R_2$, $R_3$, and $R_4$ are each independently selected from hydrogen, alkyl, alkoxyalkyl, cycloalkyl, cycloalkenyl, aryl, aralkyl, and CN.

The present invention also relates to a process for imaging a photoresist comprising coating a substrate with the above compositions, baking the substrate to substantially remove the solvent, image-wise exposing the photoresist coating, post-exposure baking the photoresist coating, and developing the photoresist coating with an aqueous alkaline solution.

The present invention also relates to a method for producing a microelectronic device by forming an image on a substrate comprising providing the above photoresist compositions, coating a suitable substrate with the photoresist composition, heat treating the coated substrate until substantially all the photoresist solvent is removed, image-wise exposing the photoresist composition and removing the image-wise exposed areas of the composition with a suitable developer.

The invention also relates to a photoresist composition which comprises a polymer selected from the group consisting of poly(2-methyl-2-adamantyl methacrylate-co-α-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-α-gamma-butyrolactone methacrylate-co-2-cyano-5-norbornyl methacrylate); poly(2-ethyl-2-adamantyl methacrylate-co-β-gamma-butyrolactone methacrylate-co-2-cyano-5-norbornyl methacrylate); poly(2-ethyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-2-ethyl-2-adamantyl methacrylate-co-2-cyano-5-norbornyl methacrylate); poly(2-methyl-2-adamantyl methacrylate-co-3-hydroxy-1-methacryloxyadamantane-co-2-cyano-5-norbornyl methacrylate); poly(t-butyl norbornene carboxylate-co-maleic anhydride-co-2-methyl-2-adamantyl methacrylate-co-β-gamma-butyrolactone methacrylate-co-2-cyano-5-norbornyl methacrylate); poly(t-butyl norbornene carboxylate-co-maleic anhydride-co-2-methyl-2-adamantyl methacrylate-co-2-cyano-5-norbornyl methacrylate-co-5-methacryloyloxy-2,6-norbornanecarbolactone); poly(2-methyl-2-adamantyl methacrylate-co-5-methacryloyloxy-2,6-norbornanecarbolactone-co-2-cyano-5-norbornyl methacrylate); poly(2-methyl-2-adamantyl methacrylate-co-2-ethyl-2-adamantyl methacrylate-co-4-isopropyl-1-methyl-5-methacryloyloxy-2,6-bicyclo[2.2.2]octanecarbolactone); poly(2-methyl-2-adamantyl methacrylate-co-3-hydroxy-1-methacryloxyadamantane-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloyloxy-2,6-norbornanecarbolactone); poly(2-methyl-2-adamantyl methacrylate-co-5-methacryloyloxy-2,6-norbornanecarbolactone-co-4-isopropyl-1-methyl-5-methacryloyloxy-2,6-bicyclo[2.2.2]octanecarbolactone); poly(2-methyl-2-adamantyl methacrylate-co-2-ethyl-2-adamantyl methacrylate-co-4-isopropyl-1-methyl-5-methoxy-6-methacryloyloxy-3,2-bicyclo[2.2.2]octanecarbolactone); poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone-co-5-methacryloyloxy-2,6-norbornanecarbolactone); poly(β-gamma-buyrolactone methacrylate-co-2-ethyl-2-adamantyl methacrylate-co-3- hydroxy-1-methacryloxyadamatane); poly(α-gamma-butyrolactone methacrylate-co-1-ethyl-1-cyclopentylmethacrylate-co-2-cyano-5-norbornyl methacrylate); poly(β-gamma-butyrolactone methacrylate-co-1-ethyl-1-cyclopentylmethacrylate-co-2-cyano-5-norbornyl methacrylate); poly(α-gamma-butyrolactone methacrylate-co-2-ethyl-2-adamantyl methacrylate-co-1-ethyl-1-cyclopentylmethacrylate-co-2-cyano-5-norbornyl methacrylate); poly(β-gamma-butyrolactone methacrylate-co-2-ethyl-2-adamantyl methacrylate-co-1-ethyl-1-cyclopentylmethacrylate-co-2-cyano-5-norbornyl methacrylate); poly(α-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); and poly(2-methyl-2-adamantyl methacrylate-co-5-methacryloyloxy-2,6-norbornanecarbolactone-co-4-isopropyl-1-methyl-5-methoxy-6-methacryloyloxy-3,2-bicyclo[2.2.2]octanecarbolactone); A further embodiment includes a photoresist composition where the polymer is selected from the group consisting of poly(2-methyl-2-adamantyl methacrylate-co-α-gamma-butyrolactone methacrylate-coβ-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6bicyclo[2.2.2]octanecarbolactone); poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-α-gamma-butyrolactone methacrylate-co-2-cyano-5-norbornyl methacrylate); poly(2-methyl-2-adamantyl methacrylate-co-β-gamma-butyrolactone methacrylate-co-2-cyno-5-norbornyl methacrylate); poly(2-ethyl-2-adamantly methacrylate-co-α-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-2-ethyl-2-adamantyl methacrylate-co-2-cyano-5-norbornyl methacrylate); poly(2-methyl-2-adamantyl methacrylate-co-3-hydroxy-1-methacryloxyadamantane-co-2-cyano-5-norbornyl methacrylate); poly(t-butyl norbornene carboxylate-co-maleic anhydride-co-2-methyl-2-adamantyl methacrylate-co-β-gamma-butyrolactone methacrylate-co-2-cyano-5-norbornyl methacrylate); poly(t-butyl norbornene carboxylate-co-maleic anhydride-co-2-methyl-2-adamantyl methacrylate-co-2-cyano-5-norbornyl methacrylate-co-5-methacryloyloxy-2,6-norbornanecarbolactone); poly(2-methyl-2-adamantyl methacrylate-co-5-methacryloyloxy-2,6-norbornanecarbolactone-co-2-cyano-5-norbornyl methacrylate); poly(2-methyl-2-adamantyl methacrylate-co-2-ethyl-2-adamantyl methacrylate-co-4-isopropyl-1-methyl-5-methacryloyloxy-2,6-bicyclo[2.2.2]octanecarbolactone); poly(2-methyl-2-adamantyl methacrylate-co-3-hydroxy-1-methacryloxyadamantane-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloyloxy-2,6-norbornanecarbolactone); poly(2-methyl-2-adamantyl methacrylate-co-5-methacryloyloxy-2,6-norbornanecarbolactone-co-4-isopropyl-1-methyl-5-methacryloyloxy-2,6-bicyclo[2.2.2]octanecarbolactone); poly(2-methyl-2-adamantyl methacrylate-co-2-ethyl-2-adamantyl methacrylate-co-4-isopropyl-1-methyl-5-methoxy-6-methacryloyloxy-3,2-bicyclo[2.2.2]octanecarbolactone); poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone-co-5-methacryloyloxy-2,6-norbornanecarbolactone); poly(β-gamma-butyrolactone methacrylate-co-2-ethyl-2-adamantyl methacrylate-co-3-hydroxy-1-methacryloxyadamatane); poly(α-gamma-butyrolactone methacrylate-co-1-ethyl-1-cyclopentylmethacrylate-co-2-cyano-5-norbornyl methacrylate); poly(β-gammabutyrolactone methacrylate-co-1-ethyl-1-cyclopentylmethacrylate-co-2-cyano-5-norbornyl methacrylate); poly(α-gamma-butyrolactone methacrylate-co-2-ethyl-2-adamantyl methacrylate-co-1-ethyl-1-cyclopentylmethacrylate-co-2-cyano-5-norbornyl methacrylate); poly(β-gamma-butyrolactone methacrylate-co-2-ethyl-2-adamantyl methacrylate-co-1-ethyl-1-cyclopentylmethacrylate-co-2-cyano-5-norbornyl methacrylate); poly(α-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(α-gamma-butyrolactone methacrylate-co-2-ethyl-2-adamantyl methacrylate-co-1-ethyl-1-cyclopentyl methacrylate-co-4-isopropyl-1-methyl-5-methoxy-6-methacryloyloxy-3,2-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); and poly(2-methyl-2-adamantyl methacrylate-co-5-methacryloyloxy-2,6-norbornanecarbolactone-co-4-isopropyl-1-methyl-5-methoxy-6-methacryloyloxy-3,2-bicyclo[2.2.2]octanecarbolactone). These photoresist compositions can also be used in a process for imaging a photoresist comprising coating a substrate with one of these photoresist compositions, baking the substrate to substantially remove the solvent, image-wise exposing the photoresist coating, post-exposure baking the photoresist coating, and developing the photoresist coating with an aqueous alkaline solution. Additionally, these photoresist compositions can be used to produce a microelectronic device by forming an image on a substrate comprising providing one of these photoresist compositions, coating a suitable substrate with the photoresist composition, heat treating the coated substrate until substantially all the photoresist solvent is removed, image-wise exposing the photoresist composition and removing the image-wise exposed areas of the composition with a suitable developer.

Photoresist compositions, where one copolymer contains α-gamma butyrolactone methacrylate monomer and another copolymer contains β-gamma butyrolactone methacrylate monomer, the polymers include monomers that have acid labile groups that make the polymer insoluble in aqueous alkaline solution, but such a polymer in the presence of an acid catalytically deprotects the polymer, wherein the polymer then becomes soluble in an aqueous alkaline solution. The polymers which are transparent below 200 nm are essentially non-aromatic, examples of which are acrylates and/or cycloolefin polymers. Such polymers are, for example, but not limited to, those described in U.S. Pat. Nos. 5,843,624, 5,879,857, WO 97/33,198, EP 789,278 and GB 2,332,679. Non-aromatic polymers that are useful for irradiation below 200 nm are substituted acrylates, cycloolefins, substituted polyethylenes, etc. Aromatic polymers based on polyhydroxystyrene and its copolymers may also be used, especially for 248 nm exposure.

Some examples of monomers having acid labile groups are generally based on poly(meth)acrylates with at least one unit containing pendant alicyclic groups, and with the acid labile group being pendant from the polymer backbone and/or from the alicyclic group. Examples of pendant alicyclic groups, which may be unsubstituted or substituted include adamantyl, tricyclodecyl, isobornyl, menthyl, norbornene, groups and their derivatives. Other pendant groups may also be incorporated into the polymer, such as mevalonic lactone, alkyloxyalkyl, etc. Examples of structures for the alicyclic group, which can be unsubstituted or substituted, include:

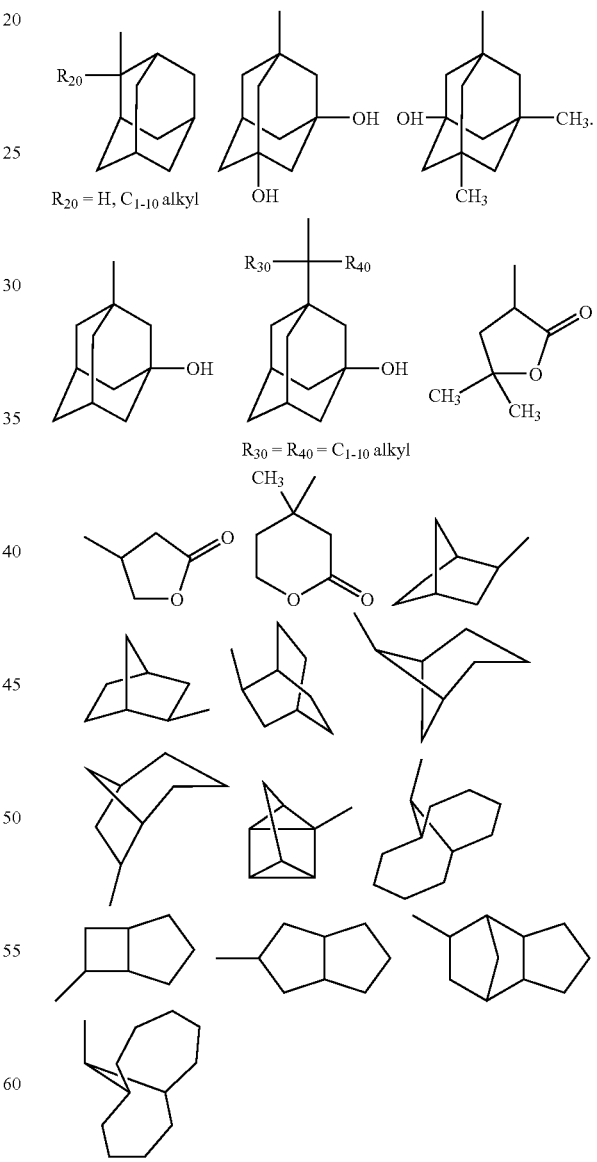

Examples of cycloolefin monomers, including for example, with norbornene and tetracyclododecene derivatives, may be polymerized by ring-opening metathesis, free-radical polymerization or using metal organic catalysts. Cycloolefin derivatives may also be copolymerized with cyclic anhydrides or with maleimide or its derivatives. Examples of cyclic anhydrides are maleic anhydride (MA) and itaconic anhydride. The cycloolefin is incorporated into the backbone of the polymer and may be any substituted or unsubstituted multicyclic hydrocarbon containing an unsaturated bond. The monomer can have acid labile groups attached. The polymer may be synthesized from one or more cycloolefin monomers having an unsaturated bond. The cycloolefin monomers may be substituted or unsubstituted norbornene, or tetracyclododecane. The substituents on the cycloolefin may be aliphatic or cycloaliphatic alkyls, esters, acids, hydroxyl, nitrite or alkyl derivatives. Examples of cycloolefin monomers, without limitation, include:

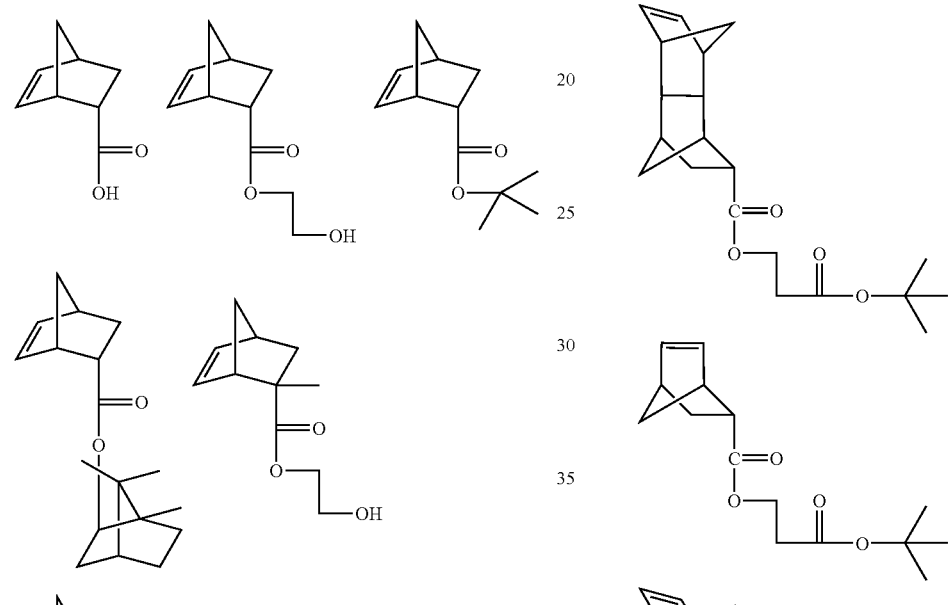

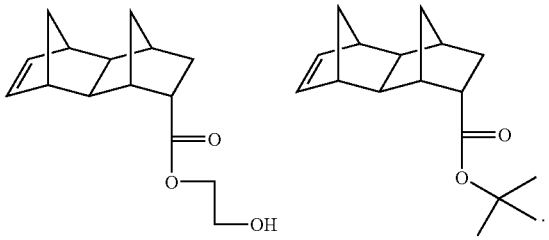

Other cycloolefin monomers which may also be used in synthesizing the polymer are:

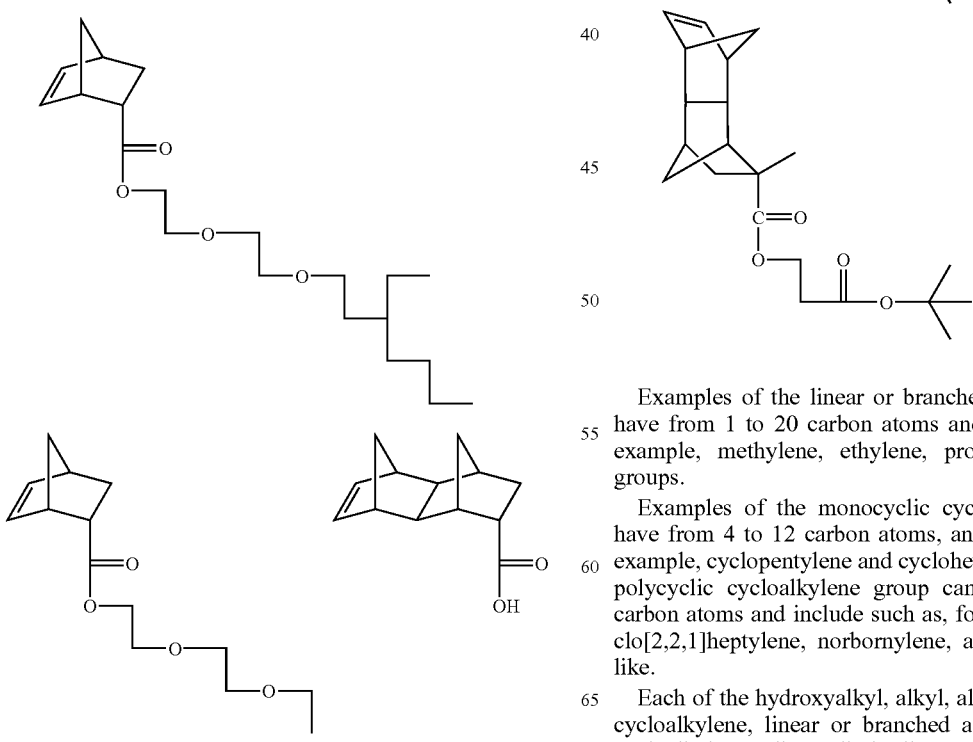

Examples of the linear or branched alkylene group can have from 1 to 20 carbon atoms and include such as, for example, methylene, ethylene, propylene and octylene groups.

Examples of the monocyclic cycloalkylene group can have from 4 to 12 carbon atoms, and include such as, for example, cyclopentylene and cyclohexylene groups, and the polycyclic cycloalkylene group can have from 5 to 50 carbon atoms and include such as, for example, 7-oxabicyclo[2,2,1]heptylene, norbornylene, adamantylene, and the like.

Each of the hydroxyalkyl, alkyl, alkoxy, aryl, cycloalkyl, cycloalkylene, linear or branched alkylene, cycloalkenyl, cycloalkyloxy, alkoxyalkyl, alkoxycycloalkyl, and aryloxy group can be unsubstituted or substituted. Examples of substituents on these groups include, but are not limited to, for example, alkyl, cycloalkyl, aryl, amino, amido, ureido, urethane, hydroxyl, carboxyl, halogen, alkoxy, thioether, acyl (e.g., acetyl, propanoyl, benzoyl), acyloxy (e.g., acetoxy, propanoyloxy, benzoyloxy), alkoxycarbonyl (e.g., methoxycarbonyl, ethoxycarbonyl, propoxycarbonyl), cyano and nitro groups.

Photoresist compositions, where one copolymer contains α-gamma butyrolactone methacrylate monomer and another copolymer contains β-gamma butyrolactone methacrylate monomer, the polymers containing mixtures of (meth)acrylate monomers, cycloolefinic monomers and cyclic anhydrides, where such monomers are described above, may also be combined into a hybrid polymer. Examples of cycloolefin monomers include those selected from t-butyl norbornene carboxylate (BNC), hydroxyethyl norbornene carboxylate (HNC), norbornene carboxylic acid (NC), t-butyltetracyclo[4.4.0.1.$^{2,6}$1.$^{7,10}$]dodec-8-ene-3-carboxylate, and t-butoxy carbonylmethyl tetracyclo[4.4.0.1.$^{2,6}$1.$^{7,10}$]dodec-8-ene-3-carboxylate. In some instances, preferred examples of cycloolefins include t-butyl norbornene carboxylate (BNC), hydroxyethyl norbornene carboxylate (HNC), and norbornene carboxylic acid (NC). Examples of (meth)acrylate monomers include those selected from mevalonic lactone methacrylate (MLMA), 2-methyl-2-adamantyl methacrylate (MAdMA), 2-methyl-2-adamantyl acrylate (MAdA), 2-ethyl-2-adamantyl methacrylate (EAdMA), 3,5-dimethyl-7-hydroxy adamantyl methacrylate (DMHAdMA), isoadamantyl methacrylate, 3-hydroxy-1-methacryloxyadamatane (HAdMA), 3-hydroxy-1-adamantyl acrylate (HADA), 1-ethyl-1-cyclopentylacrylate (ECPA), 1-ethyl-1-cyclopentylmethacrylate (ECPMA), tricyclo[5,2,1,0$^{2,6}$]deca-8-yl methacrylate (TCDMA), 3,5-dihydroxy-1-methacryloxyadamantane (DHAdMA), β-methacryloxy-γ-butyrolactone, α- or β-gamma-butyrolactone methacrylate (either α- or β-GBLMA), 5-methacryloyloxy-2,6-norbornanecarbolactone, 2-(1-methacryloyloxy)ethyl-4-butanolide (BLEMA), 2-cyano-5-norbornyl methacrylate (CNNMA), 4-isopropyl-1-methyl-5-methacryloyloxy-2,6-bicyclo[2.2.2]octanecarbolactone (DOLMA), 4-isopropyl-1-methyl-5-methoxy-6-methacryloyloxy-3,2-bicyclo[2.2.2]octanecarbolactone (DOLAMA), and α-methacryloxy-γ-butyrolactone, among others. Examples of polymers formed with these monomers include poly(2-methyl-2-adamantyl methacrylate-co-β-gamma butyrolactone methacrylate-co-2-cyano-5-norbornyl methacrylate), poly(2-methyl-2-adamantyl methacrylate-co-α-gamma butyrolactone methacrylate-co-2-cyano-5-norbornyl methacrylate), poly(2-ethyl-2-adamantyl methacrylate-co-β-gamma butyrolactone methacrylate-co-2-cyano-5-norbornyl methacrylate), poly(2-ethyl-2-adamantyl methacrylate-co-α-gamma butyrolactone methacrylate-co-2-cyano-5-norbornyl methacrylate), poly(2-methyl-2-adamantyl methacrylate-co-2-ethyl-2-adamantyl methacrylate-co-2-cyano-5-norbornyl methacrylate); poly(2-methyl-2-adamantyl methacrylate-co-3-hydroxy-1-methacryloxyadamantane-co-2-cyano-5-norbornyl methacrylate); poly(2-methyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-α-gamma-butyrolactone methacrylate-co-2-cyano-5-norbornyl methacrylate); poly(t-butyl norbornene carboxylate-co-maleic anhydride-co-2-methyl-2-adamantyl methacrylate-co-β-gamma-butyrolactone methacrylate-co-2-cyano-5-norbornyl methacrylate); and the like.

Other photoresist compositions can comprise a polymer selected from the group consisting of poly(2-methyl-2-adamantyl methacrylate-co-α-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-α-gamma-butyrolactone methacrylate-co-2-cyano-5-norbornyl methacrylate); poly(2-ethyl-2-adamantyl methacrylate-co-β-gamma-butyrolactone methacrylate-co-2-cyano-5-norbornyl methacrylate); poly(2-ethyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-2-ethyl-2-adamantyl methacrylate-co-2-cyano-5-norbornyl methacrylate); poly(2-methyl-2-adamantyl methacrylate-co-3-hydroxy-1-methacryloxyadamantane-co-2-cyano-5-norbornyl methacrylate); poly(t-butyl norbornene carboxylate-co-maleic anhydride-co-2-methyl-2-adamantyl methacrylate-co-β-gamma-butyrolactone methacrylate-co-2-cyano-5-norbornyl methacrylate); poly(t-butyl norbornene carboxylate-co-maleic anhydride-co-2-methyl-2-adamantyl methacrylate-co-2-cyano-5-norbornyl methacrylate-co-5-methacryloyloxy-2,6-norbornanecarbolactone); poly(2-methyl-2-adamantyl methacrylate-co-5-methacryloyloxy-2,6-norbornanecarbolactone-co-2-cyano-5-norbornyl methacrylate); poly(2-methyl-2-adamantyl methacrylate-co-2-ethyl-2-adamantyl methacrylate-co-4-isopropyl-1-methyl-5-methacryloyloxy-2,6-bicyclo[2.2.2]octanecarbolactone); poly(2-methyl-2-adamantyl methacrylate-co-3-hydroxy-1-methacryloxyadamantane-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloyloxy-2,6-norbornanecarbolactone); poly(2-methyl-2-adamantyl methacrylate-co-5-methacryloyloxy-2,6-norbornanecarbolactone-co-4-isopropyl-1-methyl-5-methacryloyloxy-2,6-bicyclo[2.2.2]octanecarbolactone); poly(2-methyl-2-adamantyl methacrylate-co-2-ethyl-2-adamantyl methacrylate-co-4-isopropyl-1-methyl-5-methoxy-6-methacryloyloxy-3,2-bicyclo[2.2.2]octanecarbolactone); poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone)-co-5-methacryloyloxy-2,6-norbornanecarbolactone); poly(β-gamma-butyrolactone methacrylate-co-2-ethyl-2-adamantyl methacrylate-co-3-hydroxy-1-methacryloxyadamatane); poly(α-gamma-butyrolactone methacrylate-co-1-ethyl-1-cyclopentylmethacrylate-co-2-cyano-5-norbornyl methacrylate); poly(β-gamma-butyrolactone methacrylate-co-1-ethyl-1-cyclopentylmethacrylate-co-2-cyano-5-norbornyl methacrylate); poly(α-gamma-butyrolactone methacrylate-co-2-ethyl-2-adamantyl methacrylate-co-1-ethyl-1-cyclopentylmethacrylate-co-2-cyano-5-norbornyl methacrylate); poly(β-gamma-butyrolactone methacrylate-co-2-ethyl-2-adamantyl methacrylate-co-1-ethyl-1-cyclopentylmethacrylate-co-2-cyano-5-norbornyl methacrylate); poly(α-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); and poly(2-methyl-2-adamantyl methacrylate-co-5-methacryloyloxy-2,6-norbornanecarbolactone-co-4-isopropyl-1-methyl-5-methoxy-6-methacryloyloxy-3,2-bicyclo[2.2.2]octanecarbolactone); A further embodiment includes a photoresist composition where the polymer is selected from the group consisting of poly(2-methyl-2-adamantyl methacrylate-co-α-gamma-butyrolactone methacrylate-co-β-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-α-gamma-butyrolactone bolactone-co-5-methac methacrylate-co-4-isopropyl-1-methyl-5-methacryloyloxy-2,6-bicyclo[2.2.2]octanecarbolactone); poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-α-gamma-butyrolactone methacrylate-co-2-cyano-5-norbornyl methacrylate); poly(2-ethyl-2-adamantyl methacrylate-co-β-gamma -butyrolactone methacrylate-co-2-cyano-5-norbornyl methacrylate); poly(2-ethyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-2-ethyl-2-adamantyl methacrylate-co-2-cyano-5-norbornyl methacrylate); poly(2-methyl-2-adamantyl methacrylate-co- 3-hydroxy-1-methacryloxyadamantane-co-2-cyano-5-norbornyl methacrylate); poly(t-butyl norbornene carboxylate-co-maleic anhydride-co-2-methyl-2-adamantyl methacrylate-co -β-gamma-butyrolactone methacrylate-co-2-cyano-5-norbornyl methacrylate); poly(t -butyl norbornene carboxylate-co-maleic anhydride-co-2-methyl-2-adamantyl methacrylate-co-2-cyano-5-norbornyl methacrylate-co-5-methacryloyloxy-2,6-norbornanecarbolactone); poly(2-methyl-2-adamantyl methacrylate-co-5-methacryloyloxy-2,6-norbornanecarbolactone-co-2-cyano-5-norbornyl methacrylate); poly(2-methyl-2-adamantyl methacrylate-co-2-ethyl-2-adamantyl methacrylate-co-4-isopropyl-1-methyl-5-methacryloyloxy-2,6-bicyclo[2.2.2]octanecarbolactone); poly(2-methyl-2-adamantyl methacrylate-co-3-hydroxy-1-methacryloxyadamantane-co-4-isopropyl-1-methyl-5methacryloyloxy-2,6-bicyclo[2.2.2]octanecarbolactone); poly(t-butyl norbornene carboxylate-co-maleic anhydride-co-2-methyl-2-adamantyl methacrylate-co -β-gamma-butyrolactone methacrylate-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloxy-2,6-norbornanecarbolactone); poly(2-methyl-2-adamantyl methacrylate-co-5-methacryloyloxy-2,6-norbornanecarbolactone-co-4-isopropyl-1-methyl-5-methacryloyloxy-2,6-bicyclo[2.2.2]octanecarbolactone); poly(2-methyl-2-adamantyl methacrylate-co-2-ethyl-2-adamantyl methacrylate-co-4-isopropyl-1-methyl-5-methoxy -6-methacryloyloxy-3,2-bicyclo[2.2.2]octanecarbolactone); poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co -β-gamma-butyrolactone methacrylate-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-4-isopropyl -1-methyl-5-methoxy-6-methacryloyloxy-3,2-bicyclo[2.2.2]octanecarbolactone-co-5-methacryloxy-2,6-norbornanecarbolactone); poly(β-gamma-butyrolactone methacrylate-co-2-ethyl-2-adamantyl methacrylate-co-3-hydroxy-1-methacryloxyadamatane); poly(α-gamma-butyrolactone methacrylate-co-1-ethyl-1-cyclopentylmethacrylate-co-2-cyano-5-norbornyl methacrylate); poly(β-gamma -butyrolactone methacrylate-co-1-ethyl-1-cyclopentylmethacrylate-co-2-cyano-5-norbornyl methacrylate); poly(α-gamma-butyrolactone methacrylate-co-2-ethyl-2-adamantyl methacrylate-co-1-ethyl-1-cyclopentylmethacrylate-co-2-cyano-5-norbornyl methacrylate); poly(β-gamma-butyrolactone methacrylate-co-2-ethyl-2-adamantyl methacrylate-co-1-ethyl-1-cyclopentylmethacrylate-co-2-cyano-5-norbornyl methacrylate); poly(α-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma -butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-1-ethyl-1-cyclopentylmethacrylate-co-4-isopropyl-1-methyl-5-methoxy-6-methacryloyloxy -3,2-bicyclo[2.2.2]octanecarbolactone); poly(β-gamma-butyrolactone methacrylate-co-1-ethyl-1-cyclopentylmethacrylate-co-4-isopropyl-1-methyl-5-methoxy-6-methacryloyloxy -3,2-bicyclo[2.2.2] octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2] octanecarbolactone); and poly(2-methyl-2-adamantyl methacrylate-co-5-methacryloyloxy-2,6-norbornanecarbolactone-co-4-isopropyl-1methyl-5methoxy-6-methacryloyloxy-3,2-bicyclo[2.2.2]octanecarbolactone). These photorist compositions can also be used in a process for imaging a photoresist comprising coating a substrate with one of these photoresist compositions, baking the substrate to substantially remove the solvent, image-wise exposing the photoresist coating, post-exposure baking the photoresist coating, and developing the photoresist coating with an aqueous alkaline solution. Additionally, these photoresist compositions can be used to produce a microelectronic device by forming an image on a substrate comprising providing one of these photoresist compositions, coating a suitable substrate with the photoresist composition, heat treating the coated substrate until substantially all the photoresist solvent is removed, image-wise exposing the photoresist composition and removing the image-wise exposed areas of the composition with a suitable developer.

Standard synthetic methods are typically employed to make the various types of suitable polymers. Procedures or references to suitable standard procedures (e.g., free radical polymerization) can be found in the aforementioned documents.

The cycloolefin and the cyclic anhydride monomer are believed to form an alternating polymeric structure, and the amount of the (meth)acrylate monomer incorporated into the polymer can be varied to give the optimal lithographic properties. The percentage of the (meth)acrylate monomer relative to the cycloolefin/anhydride monomers within the polymer ranges from about 95 mole % to about 5 mole %, further ranging from about 75 mole % to about 25 mole %, and also further ranging from about 55 mole % to about 45 mole %.

Polymers synthesized from cycloolefins and cyano containing ethylenic monomers are described in the U.S. Pat. No. 6,686,429, the contents of which are hereby incorporated herein by reference, may also be used.

By the term "aryl" is meant a radical derived from an aromatic hydrocarbon by the elimination of one atom of hydrogen and can be substituted or unsubstituted. The aromatic hydrocarbon can be mononuclear or polynuclear. Examples of aryl of the mononuclear type include phenyl, tolyl, xylyl, mesityl, cumenyl, and the like. Examples of aryl of the polynuclear type include naphthyl, anthryl, phenanthryl, and the like. The aryl group can be unsubstituted or substituted as provided for hereinabove.

By the term "aralkyl" is meant an alkyl group containing an aryl group. It is a hydrocarbon group having both aromatic and aliphatic structures, that is, a hydrocarbon group in which a lower alkyl hydrogen atom is substituted by a mononuclear or polynuclear aryl group.

Examples of $C_{3-50}$ monocyclic or polycyclic alkyl groups are well know to those skilled in the art and include, for example, cyclohexyl, 2-methyl-2-norbornyl, 2-ethyl-2-norbornyl, 2-methyl-2-isobornyl, 2-ethyl-2-isobornyl, 2-methyl-2-adamantyl, 2-ethyl-2-adamantyl, 1-adamantyl-1-methylethyl, and the like.

The molecular weight of the polymers is optimized based on the type of chemistry used and on the lithographic performance desired. Typically, the weight average molecular weight is in the range of 3,000 to 30,000 and the polydispersity is in the range 1.1 to 5, preferably 1.5 to 2.5.

The solid components of the present invention are dissolved in an organic solvent. The amount of solids in the solvent or mixture of solvents ranges from about 1 weight % to about 50 weight %. The polymer may be in the range of 5 weight % to 90 weight % of the solids and the photoacid generator may be in the range of 1 weight % to about 50 weight % of the solids. Suitable solvents for such photoresists may include a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The photosensitive component is well known to those of ordinary skill in the art. Suitable examples, without limitation, of the photosensitive compound include onium-salts, such as, diazonium salts, iodonium salts, sulfonium salts, halides and esters, although any photosensitive compound that produces an acid upon irradiation may be used. The onium salts are usually used in a form soluble in organic solvents, mostly as iodonium or sulfonium salts, examples of which are diphenyliodoinum trifluoromethane sulfonate, diphenyliodoinum nonafluorobutanesulfonate, triphenylsulfonium trifluromethanesuflonate, triphenylsulfonium nonafluorobutanesufonate and the like. Other compounds that form an acid upon irradiation may be used, such as triazines, oxazoles, oxadiazoles, thiazoles, substituted 2-pyrones. Phenolic sulfonic esters, bis-sulfonylmethane, bis-sulfonylmethanes or bis-sulfonyldiazomethanes, are also useful. Other useful photosensitive components are also found in U.S. patent application Ser. No. 10/439,472, filed May 16, 2003, the contents of which are hereby incorporated herein by reference. Still other useful photosensitive components include those compounds represented by the formula

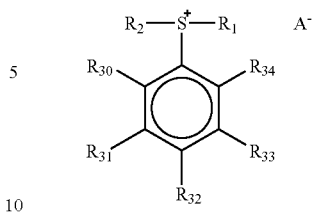

wherein $R_1$ and $R_2$ are each independently selected from $C_{1-20}$ straight or branched alkyl chain; each of $R_{30}$, $R_{31}$, $R_{32}$, $R_{33}$, and $R_{34}$ are independently selected from Z, hydrogen, $C_{1-20}$ straight or branched alkyl chain optionally containing one or more O atoms, $C_{3-50}$ monocyclic or polycyclic alkyl group, $C_{5-50}$ cyclic alkylcarbonyl group, $C_{6-50}$ aryl group, $C_{6-50}$ aralkyl group, arylcarbonylmethylene group, $-OR_4$ where $R_4$ is hydrogen, $C_{1-20}$ straight or branched alkyl group or $C_{3-50}$ monocyclic or polycyclic alkyl group; Z is $-(O)_k-(V)_n-Y$, where V is a linkage group selected from a divalent $C_{1-20}$ straight or branched alkyl group, divalent $C_{5-50}$ aryl group, divalent $C_{5-50}$ aralkyl group, or divalent $C_{3-50}$ monocyclic or polycyclic alkyl group; Y is selected from $-C(=O)-O-R_8$ and $-O-C(=O)-R_8$; $R_8$ is a $C_{1-20}$ straight or branched alkyl chain optionally containing one or more O atoms, a $C_{3-50}$ monocyclic or polycyclic alkyl group, or a $C_{5-50}$ aryl group; k is 0 or 1, and n is 0 or 1; the $C_{1-20}$ straight or branched alkyl chain optionally containing one or more O atoms, $C_{1-20}$ straight or branched alkyl chain, $C_{3-50}$ monocyclic or polycyclic alkyl group, $C_{5-50}$ cyclic alkylcarbonyl group, $C_{5-50}$ aralkyl group, $C_{5-50}$ aryl group, or arylcarbonylmethylene group being unsubstituted or substituted by one or more groups selected from the group consisting of Z, halogen, $C_{1-20}$ alkyl, $C_{1-20}$ perfluoroalkyl $C_{3-20}$ cyclic alkyl, $C_{1-20}$ alkoxy, $C_{3-20}$ cyclic alkoxy, di $C_{1-20}$ alkylamino, dicyclic di $C_{1-20}$ alkylamino, hydroxyl, cyano, nitro, tresyl, oxo, aryl, aralkyl, oxygen atom, $CF_3SO_3$, aryloxy, arylthio, and groups of formulae (II) to (VI):

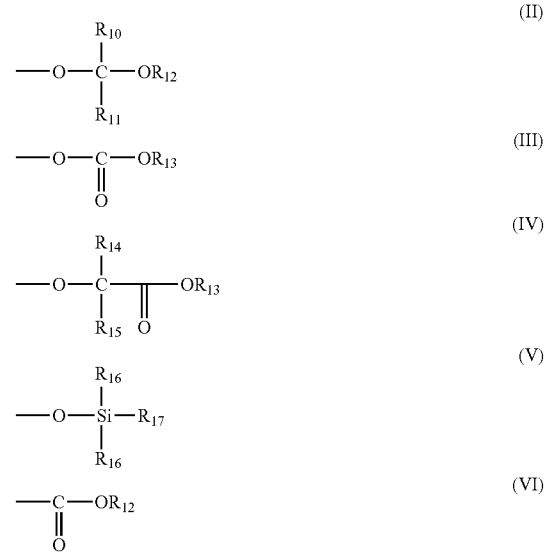

$R_{10}$ and $R_{11}$ each independently represent a hydrogen atom, a $C_{1-20}$ straight or branched alkyl chain optionally containing one or more O atoms, or a $C_{3-50}$ monocyclic or polycyclic alkyl group, or $R_{10}$ and $R_{11}$ together can represent an alkylene group to form a five- or six-membered ring, $R_{12}$ represents a $C_{1-20}$ straight or branched alkyl chain optionally containing one or more O atoms, a $C_{3-50}$ monocyclic or polycyclic alkyl group, or a $C_{5-50}$ aralkyl group, or $R_{10}$ and $R_{12}$ together represent an alkylene group which forms a five- or six-membered ring together with the interposing —C—O— group, the carbon atom in the ring being optionally substituted by an oxygen atom, $R_{13}$ represents a $C_{1-20}$ straight or branched alkyl chain optionally containing one or more O atoms or a $C_{3-50}$ monocyclic or polycyclic alkyl group, $R_{14}$ and $R_{15}$ each independently represent a hydrogen atom, a $C_{1-20}$ straight or branched alkyl chain optionally containing one or more O atoms or a $C_{3-50}$ monocyclic or polycyclic alkyl group, $R_{16}$ represents a $C_{1-20}$ straight or branched alkyl chain optionally containing one or more O atoms, a $C_{3-50}$ monocyclic or polycyclic alkyl group, a $C_{5-50}$ aryl group, or a $C_{5-50}$ aralkyl group, and $R_{17}$ represents $C_{1-20}$ straight or branched alkyl chain optionally containing one or more O atoms, a $C3_{-50}$ monocyclic or polycyclic alkyl group, a $C_{5-50}$ aryl group, a $C_{5-50}$ aralkyl group, the group —Si$(R_{16})_2R_{17}$, or the group —O—Si$(R_{16})_2R_{17}$, the $C_{1-20}$ straight or branched alkyl chain optionally containing one or more O atoms, $C_{3-50}$ monocyclic or polycyclic alkyl group, $C_{5-50}$ aryl group, and $C_{5-50}$ aralkyl group being unsubstituted or substituted as above; and A⁻ is an anion represented by the formula

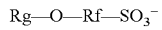

Rg—O—Rf—SO$_3^-$ where Rf is selected from the group consisting of linear or branched $(CF_2)_j$ where j is an integer from 4 to 10 and $C_3$–$C_{12}$ perfluorocycloalkyl divalent radical which is optionally perfluoro $C_{1-10}$alkyl substituted, Rg is selected from the group consisting of $C_1$–$C_{20}$ linear, branched, monocyclic or polycyclic alkyl, $C_1$–$C_{20}$ linear, branched, monocyclic or polycyclic alkenyl, $C_{5-50}$ aryl, and $C_{5-50}$ aralkyl, the alkyl, alkenyl, aralkyl and aryl groups being unsubstituted, substituted, partially fluorinated or perfluorinated.

Various other additives such as colorants, non-actinic dyes, adhesion promoters, coating aids, photospeed enhancers, additional photoacid generators, and solubility enhancers (for example, certain small levels of solvents not used as part of the main solvent (examples of which include glycol ethers and glycol ether acetates, valerolactone, ketones, lactones, and the like), surfactants and the like may be added to the photoresist composition before the solution is coated onto a substrate. Surfactants that improve film thickness uniformity, such as fluorinated surfactants, can be added to the photoresist solution. A sensitizer that transfers energy from a particular range of wavelengths to a different exposure wavelength may also be added to the photoresist composition. Often bases are also added to the photoresist to prevent t-tops or bridging at the surface of the photoresist image. Examples of bases are amines, alcohol amines, ammonium hydroxide, and photosensitive bases. Examples of bases include trioctylamine, ethylamine, diisopropylamine, triethylamine, triethanolamine, 2-aminoethanol, dicyclohexylamine, dicyclohexylmethylamine, methyldicyclohexylamine, diethanolamine, aniline, methylaniline, dimethylaniline, diisopropylaniline, tetramethyl ammonium hydroxide and tetrabutyl ammonium hydroxide.

The prepared photoresist composition solution can be applied to a substrate by any conventional method used in the photoresist art, including dipping, spraying, and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over antireflective coatings.

The photoresist coatings produced by the described procedure are particularly suitable for application to silicon/silicon dioxide wafers, such as are utilized in the production of microprocessors and other miniaturized integrated circuit components. An aluminum/aluminum oxide wafer can also be used. The substrate may also comprise various polymeric resins, especially transparent polymers such as polyesters.

The photoresist composition solution is then coated onto the substrate, and the substrate is treated (baked) at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature. Treatment (baking) is conducted until substantially all of the solvents have evaporated and a thin coating of photoresist composition, on the order of half a micron (micrometer) in thickness, remains on the substrate. In one embodiment the temperature is from about 95° C. to about 120° C. The treatment is conducted until the rate of change of solvent removal becomes relatively insignificant. The film thickness, temperature and time selection depends on the photoresist properties desired by the user, as well as the equipment used and commercially desired coating times. The coated substrate can then be image-wise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 150° C., more preferably from about 100° C. to about 130° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One example of a developer is an aqueous solution of tetramethyl ammonium hydroxide. After removal of the coated wafers from the developing solution, one may conduct an optional post-development heat treatment or bake to increase the coating's adhesion and chemical resistance to etching conditions and other substances. The post-development heat treatment can comprise the oven baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid base etching solution or dry etching. Prior to dry etching the photoresist may be treated to electron beam curing in order to increase the dry-etch resistance of the photoresist.

The invention further provides a method for producing a semiconductor device by producing a photo-image on a substrate by coating a suitable substrate with a photoresist composition. The subject process comprises coating a suitable substrate with a photoresist composition and heat treating the coated substrate until substantially all of the photoresist solvent is removed; image-wise exposing the composition and removing the image-wise exposed areas of such composition with a suitable developer.

The following examples provide illustrations of the methods of producing and utilizing the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

SYNTHESIS EXAMPLE 1 poly(2-methyl-2-adamantyl methacrylate-co-β-gamma-butyrolactone methacrylate-co-2-cyano-5-norbornyl methacrylate)

Into a reaction vessel equipped with an agitator, a thermometer, a reflux condenser, tube for introducing nitrogen gas were introduced propylene glycol monomethyl ether acetate, azobismethylbutyronitrile as the initiator, 1-octathiol as the chain transfer agent and the following monomers: 2-methyl-2-adamantyl methacrylate, β-gamma-butyrolactone methacrylate, 2-cyano-5-norbornyl methacrylate (in a molar feed ratio of 40/40/20). The temperature of the contents was raised under a nitrogen blanket and polymerization was conducted at 80° C. for 7 hours to obtain the acrylic copolymer.

SYNTHESIS EXAMPLE 2 poly(2-methyl-2-adamantyl methacrylate-co-α-gamma-butyrolactone methacrylate-co-2-cyano-5-norbornyl methacrylate)

Synthesis Example 1 was repeated except that α-gamma-butyrolactone methacrylate was substituted for β-gamma-butyrolactone methacrylate, yielding poly(2-methyl-2-adamantyl methacrylate-co-α-gamma-butyrolactone methacrylate-co-2-cyano -5-norbornyl methacrylate).

SYNTHESIS EXAMPLE 3 poly(2-methyl-2-adamantyl methacrylate-co-α-gamma-butyrolactone methacrylate-co-4-isopropyl-1-methyl-5-methacryloyloxy-2,6-bicyclo[2.2.2]octanecarbolactone)

Synthesis Example 1 can be repeated except that 4-isopropyl-1-methyl-5-methacryloyloxy-2,6-bicyclo[2.2.2]octanecarbolactone is substituted for 2-cyano-5-norbornyl methacrylate, yielding poly(2-methyl-2-adamantyl methacrylate-co-α-gamma -butyrolactone methacrylate-co-4-isopropyl-1-methyl-5-methacryloyloxy-2,6-bicyclo[2.2.2]octanecarbolactone).

SYNTHESIS EXAMPLE 4 poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone)

Synthesis Example 3 can be repeated except that β-gamma-butyrolactone methacrylate is substituted for α-gamma-butyrolactone methacrylate, yielding poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone).

SYNTHESIS EXAMPLE 5 poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone)

Synthesis Example 1 can be repeated except that 4-isopropyl-1-methyl-5-methoxy-6-methacryloyloxy-3,2-bicyclo[2.2.2]octanecarbolactone is substituted for 2-cyano-5-norbornyl methacrylate, yielding poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone).

SYNTHESIS EXAMPLE 6 poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone)

Synthesis Example 3 can be repeated except that β-gamma-butyrolactone methacrylate is substituted for α-gamma-butyrolactone methacrylate, yielding poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone).

SYNTHESIS EXAMPLE 7 poly(2-ethyl-2-adamantyl methacrylate-co-α-gamma-butyrolactone methacrylate-co-2-cyano-5-norbornyl methacrylate)

Synthesis Example 1 can be repeated except that 2-ethyl-2-adamantyl methacrylate is substituted for 2-methyl-2-adamantyl methacrylate, yielding poly(2-ethyl -2-adamantyl methacrylate-co-α-gamma-butyrolactone methacrylate-co-2-cyano-5-norbornyl methacrylate).

SYNTHESIS EXAMPLE 8 poly(2-ethyl-2-adamantyl methacrylate-co-β-gamma-butyrolactone methacrylate-co-2-cyano-5-norbornyl methacrylate)

Synthesis Example 7 can be repeated except that β-gamma-butyrolactone methacrylate is substituted for α-gamma-butyrolactone methacrylate, yielding poly(2-ethyl-2-adamantyl methacrylate-co-β-gamma-butyrolactone methacrylate-co-2-cyano-5-norbornyl methacrylate).

SYNTHESIS EXAMPLE 9 poly(2-ethyl-2-adamantyl methacrylate-co-α-gamma-butyrolactone methacrylate-co-4-isopropyl-1-methyl-5-methacryloyloxy-2,6-bicyclo[2.2.2]octanecarbolactone)

Synthesis Example 3 can be repeated except that 2-ethyl-2-adamantyl methacrylate is substituted for 2-methyl-2-adamantyl methacrylate, yielding poly(2-ethyl -2-adamantyl methacrylate-co-α-gamma-butyrolactone methacrylate-co-4-isopropyl-1-methyl-5-methacryloyloxy-2,6-bicyclo[2.2.2]octanecarbolactone).

SYNTHESIS EXAMPLE 10 poly(2-ethyl-2-adamantyl methacrylate-co-13-gamma-butyrolactone methacrylate-co-4-isopropyl-1-methyl-5-methacryloyloxy-2,6-bicyclo[2.2.2]octanecarbolactone)

Synthesis Example 9 can be repeated except that β-gamma-butyrolactone methacrylate is substituted for α-gamma-butyrolactone methacrylate, yielding poly(2-ethyl-2-adamantyl methacrylate-co-β-gamma-butyrolactone methacrylate-co-4-isopropyl-1-methyl-5-methacryloyloxy-2,6-bicyclo[2.2.2]octanecarbolactone).

SYNTHESIS EXAMPLE 11 poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone)

Synthesis Example 5 can be repeated except that 2-ethyl-2-adamantyl methacrylate is substituted for 2-methyl-2-adamantyl methacrylate, yielding poly(2-ethyl -2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone).

SYNTHESIS EXAMPLE 12 poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone)

Synthesis Example 11 can be repeated except that β-gamma-butyrolactone methacrylate is substituted for α-gamma-butyrolactone methacrylate, yielding poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone).

SYNTHESIS EXAMPLE 13 poly(2-methyl-2-adamantyl methacrylate-co-2-ethyl-2-adamantyl methacrylate-co-2-cyano-5-norbornyl methacrylate)

Into a reaction vessel equipped with an agitator, a thermometer, a reflux condenser, tube for introducing nitrogen gas are introduced propylene glycol monomethyl ether acetate, azobismethylbutyronitrile as the initiator, 1-octathiol as the chain transfer agent and the following monomers: 2-methyl-2-adamantyl methacrylate, 2-ethyl-2-adamantyl methacrylate, 2-cyano-5-norbornyl methacrylate (in a molar feed ratio of 40/40/20). The temperature of the contents is raised under a nitrogen blanket and polymerization is conducted at 80° C. for 7 hours to obtain the acrylic copolymer.

SYNTHESIS EXAMPLE 14 poly(2-methyl-2-adamantyl methacrylate-co-3-hydroxy-1-methacryloxyadamantane-co-2-cyano-5-norbornyl methacrylate)

Synthesis Example 13 can be repeated except that 3-hydroxy-1-methacryloxyadamantane is substituted for 2-ethyl-2-adamantyl methacrylate, yielding poly(2-methyl-2-adamantyl methacrylate-co-3-hydroxy-1-methacryloxyadamantane-co -2-cyano-5-norbornyl methacrylate)

SYNTHESIS EXAMPLE 15 poly(t-butyl norbornene carboxylate-co-maleic anhydride-co-2-methyl-2-adamantyl methacrylate-co-β-gamma-butyrolactone methacrylate-co -2-cyano-5-norbornyl methacrylate)

Into a reaction vessel equipped with an agitator, a thermometer, a reflux condenser, tube for introducing nitrogen gas are introduced propylene glycol monomethyl ether acetate, azobismethylbutyronitrile as the initiator, 1-octathiol as the chain transfer agent and the following monomers: t-butyl norbornene carboxylate, maleic anhydride, 2-methyl-2-adamantyl methacrylate, β-gamma-butyrolactone methacrylate, and 2-cyano-5-norbornyl methacrylate (in a molar feed ratio of 10/10/40/30/10). The temperature of the contents is raised under a nitrogen blanket and polymerization is conducted at 80° C. for 7 hours to obtain the acrylic copolymer.

SYNTHESIS EXAMPLE 16 poly(t-butyl norbornene carboxylate-co-maleic anhydride-co-2-methyl-2-adamantyl methacrylate-co-2-cyano-5-norbornyl methacrylate-co-5-methacryloyloxy-2,6-norbornanecarbolactone)

Synthesis Example 15 can be repeated except that 5-methacryloyloxy-2,6-norbornanecarbolactone is substituted for β-gamma-butyrolactone methacrylate, yielding poly(t-butyl norbornene carboxylate-co-maleic anhydride-co-2-methyl- 2-adamantyl methacrylate-co-2-cyano-5-norbornyl methacrylate-co-5-methacryloyloxy -2,6-norbornanecarbolactone).

SYNTHESIS EXAMPLE 17 poly(2-methyl-2-adamantyl methacrylate-co-5-methacryloyloxy -2,6-norbornanecarbolactone-co-2-cyano-5-norbornyl methacrylate)

Into a reaction vessel equipped with an agitator, a thermometer, a reflux condenser, tube for introducing nitrogen gas are introduced propylene glycol monomethyl ether acetate, azobismethylbutyronitrile as the initiator, 1-octathiol as the chain transfer agent and the following monomers: 2-methyl-2-adamantyl methacrylate, 5-methacryloyloxy-2,6-norbornanecarbolactone, and 2-cyano-5-norbornyl methacrylate (in a molar feed ratio of 50/25/25). The temperature of the contents is raised under a nitrogen blanket and polymerization is conducted at 80° C. for 7 hours to obtain the acrylic copolymer.

SYNTHESIS EXAMPLE 18 poly(2-methyl-2-adamantyl methacrylate-co-2-ethyl-2-adamantyl methacrylate-co-4-isopropyl-1-methyl-5-methacryloyloxy-2,6-bicyclo[2.2.2]octanecarbolactone)

Into a reaction vessel equipped with an agitator, a thermometer, a reflux condenser, tube for introducing nitrogen gas are introduced propylene glycol monomethyl ether acetate, azobismethylbutyronitrile as the initiator, 1-octathiol as the chain transfer agent and the following monomers: 2-methyl-2-adamantyl methacrylate, 2-ethyl-2-adamantyl methacrylate, and 4-isopropyl-1-methyl-5-methacryloyloxy-2,6-bicyclo[2.2.2]octanecarbolactone (in a molar feed ratio of 40/30/30). The temperature of the contents is raised under a nitrogen blanket and polymerization is conducted at 80° C. for 7 hours to obtain the acrylic copolymer.

SYNTHESIS EXAMPLE 19 poly(2-methyl-2-adamantyl methacrylate-co-3-hydroxy-1-methacryloxyadamantane-co-4-isopropyl-1-methyl-5-methacryloyloxy-2,6-bicyclo[2.2.2]octanecarbolactone)

Synthesis Example 18 can be repeated except that 3-hydroxy-1-methacryloxyadamantane is substituted for 2-ethyl-2-adamantyl methacrylate, yielding poly(2-methyl-2-adamantyl methacrylate-co-3-hydroxy-1-methacryloxyadamantane-co -4-isopropyl-1-methyl-5-methacryloyloxy-2,6-bicyclo[2.2.2]octanecarbolactone)

SYNTHESIS EXAMPLE 20 poly(t-butyl norbornene carboxylate-co-maleic anhydride-co-2-methyl-2-adamantyl methacrylate-co-β-gamma-butyrolactone methacrylate-co-4-isopropyl-1-methyl-5-methacryloyloxy-2,6-bicyclo [2.2.2]octanecarbolactone)

Synthesis Example 15 can be repeated except that 4-isopropyl-1-methyl-5-methacryloyloxy-2,6-bicyclo[2.2.2]octanecarbolactone is substituted for 2-cyano-5-norbornyl methacrylate, yielding poly(t-butyl norbornene carboxylate-co-maleic anhydride-co-2-methyl-2-adamantyl methacrylate-co-β-gamma-butyrolactone methacrylate-co-4-isopropyl-1-methyl-5-methacryloyloxy-2,6-bicyclo[2.2.2] octanecarbolactone).

SYNTHESIS EXAMPLE 21 poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloyloxy-2,6-norboranecarbolactone)

Synthesis Example 20 can be repeated except that 5-methacryloyloxy-2,6-norbornanecarbolactone is substituted for β-gamma-butyrolactone methacrylate, yielding poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloyloxy-2,6-norboranecarbolactone)

SYNTHESIS EXAMPLE 22 poly(2-methyl-2-adamantyl methacrylate-co-5-methacryloyloxy -2,6-norbornanecarbolactone-co-4-isopropyl-1-methyl-5-methacryloyloxy-2,6-bicyclo [2.2.2]octanecarbolactone)

Synthesis Example 17 can be repeated except that 4-isopropyl-1-methyl-5-methacryloyloxy-2,6-bicyclo[2.2.2]octanecarbolactone is substituted for 2-cyano-5-norbornyl methacrylate, yielding poly(2-methyl-2-adamantyl methacrylate-co-5-methacryloyloxy-2,6-norbornanecarbolactone-co-4-isopropyl-1-methyl-5-methacryloyloxy-2,6-bicyclo[2.2.2]octanecarbolactone).

SYNTHESIS EXAMPLE 23 poly(2-methyl-2-adamantyl methacrylate-co-2-ethyl-2-adamantyl methacrylate-co-4-isopropyl-1-methyl-5-methoxy-6-methacryloyloxy-3,2-bicyclo[2.2.2] octanecarbolactone)

Synthesis Example 18 can be repeated except that 4-isopropyl-1-methyl-5-methoxy-6-methacryloyloxy-3,2-bicyclo[2.2.2]octanecarbolactone is substituted for 4-isopropyl-1-methyl-5-methacryloyloxy-2,6-bicyclo[2.2.2] octanecarbolactone, yielding poly(2-methyl-2-adamantyl methacrylate-co-3-hydroxy-1-methacryloxyadamantane-co-).

SYNTHESIS EXAMPLE 24 poly(2-methyl-2-adamantyl methacrylate-co-3-hydroxy-1-methacryloxyadamantane-co-4-isopropyl-1-methyl-5-methoxy-6-methacryloyloxy-3,2-bicyclo [2.2.2]octanecarbolactone)

Synthesis Example 23 can be repeated except that 3-hydroxy-1-methacryloxyadamantane is substituted for 2-ethyl-2-adamantyl methacrylate, yielding poly(2-methyl-2-adamantyl methacrylate-co-3-hydroxy-1-methacryloxyadamantane-co -4-isopropyl-1-methyl-5-methoxy-6-methacryloyloxy-3,2-bicyclo[2.2.2] octanecarbolactone).

SYNTHESIS EXAMPLE 25 poly(t-butyl norbornene carboxylate-co-maleic anhydride-co-2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone)

Synthesis Example 20 can be repeated except that 4-isopropyl-1-methyl-5-methoxy-6-methacryloyloxy-3,2-bicyclo[2.2.2]octanecarbolactone is substituted for 4-isopropyl-1-methyl-5-methacryloyloxy-2,6-bicyclo[2.2.2]octanecarbolactone, yielding poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone).

SYNTHESIS EXAMPLE 26 poly(t-butyl norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone-co-5-methacryloyloxy-2,6-norbornanecarbolactone)

Synthesis Example 25 can be repeated except that 5-methacryloyloxy-2,6-norbornanecarbolactone is substituted for β-gamma-butyrolactone methacrylate, yielding poly(t-butyl norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone-co-5-methacryloyloxy-2,6-norbornanecarbolactone)

SYNTHESIS EXAMPLE 27 poly(2-methyl-2-adamantyl methacrylate-co-5-methacryloyloxy-2,6-norbornanecarbolactone-co-4-isopropyl-1-methyl-5-methoxy-6-methacryloyloxy-3,2-bicyclo[2.2.2]octanecarbolactone)

Synthesis Example 22 can be repeated except that 4-isopropyl-1-methyl-5-methoxy-6-methacryloyloxy-3,2-bicyclo[2.2.2]octanecarbolactone is substituted for 4-isopropyl-1-methyl-5-methacryloyloxy-2,6-bicyclo[2.2.2]octanecarbolactone, yielding poly(2-methyl-2-adamantyl methacrylate-co-5-methacryloyloxy-2,6-norbornanecarbolactone-co-4-isopropyl-1-methyl-5-methoxy-6-methacryloyloxy-3,2-bicyclo[2.2.2]octanecarbolactone).

SYNTHESIS EXAMPLE 28 poly(2-methyl-2-adamantyl methacrylate-co-α-gamma-butyrolactone methacrylate-co-β-gamma-butyrolactone methacrylate-co-2-cyano-5-norbornyl methacrylate)

Into a reaction vessel equipped with an agitator, a thermometer, a reflux condenser, tube for introducing nitrogen gas can be introduced propylene glycol monomethyl ether acetate, azobismethylbutyronitrile as the initiator, 1-octathiol as the chain transfer agent and the following monomers: 2-methyl-2-adamantyl methacrylate, α-gamma-butyrolactone methacrylate, β-gamma-butyrolactone methacrylate, 2-cyano-5-norbornyl methacrylate (in a molar feed ratio of 40/30/10/20). The temperature of the contents is raised under a nitrogen blanket and polymerization is conducted at 80° C. for 7 hours to obtain the acrylic copolymer.

SYNTHESIS EXAMPLE 29 poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone)

Synthesis Example 28 can be repeated except that 4-isopropyl-1-methyl-5-methoxy-6-methacryloyloxy-3,2-bicyclo[2.2.2]octanecarbolactone is substituted for 2-cyano-5-norbornyl methacrylate, yielding poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone).

SYNTHESIS EXAMPLE 30 poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone)

Synthesis Example 28 can be repeated except that 4-isopropyl-1-methyl-5-methoxy-6-methacryloyloxy-3,2-bicyclo[2.2.2]octanecarbolactone is substituted for 2-cyano-5-norbornyl methacrylate, yielding poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone).

SYNTHESIS EXAMPLE 31 poly(13-gamma-butyrolactone methacrylate-co-2-ethyl-2-adamantyl methacrylate-co-3-hydroxy-1-methacryloxyadamatane)

Into a reaction vessel equipped with an agitator, a thermometer, a reflux condenser, tube for introducing nitrogen gas can be introduced propylene glycol monomethyl ether acetate, azobismethylbutyronitrile as the initiator, 1-octathiol as the chain transfer agent and the following monomers: β-gamma-butyrolactone methacrylate, 2-ethyl-2-adamantyl methacrylate, and 3-hydroxy-1-methacryloxyadamatane (in a molar feed ratio of 40/30/30). The temperature of the contents is raised under a nitrogen blanket and polymerization is conducted at 80° C. for 7 hours to obtain the acrylic copolymer.

SYNTHESIS EXAMPLE 32 poly(α-gamma-butyrolactone methacrylate-co-1-ethyl-1-cyclopentylmethacrylate-co-2-cyano-5-norbornyl methacrylate)

Into a reaction vessel equipped with an agitator, a thermometer, a reflux condenser, tube for introducing nitrogen gas can be introduced propylene glycol monomethyl ether acetate, azobismethylbutyronitrile as the initiator, 1-octathiol as the chain transfer agent and the following monomers: α-gamma-butyrolactone methacrylate, 1-ethyl-1-cyclopentyl methacrylate, and 2-cyano-5-norbornyl methacrylate (in a molar feed ratio of 30/40/30). The temperature of the contents is raised under a nitrogen blanket and polymerization is conducted at 80° C. for 7 hours to obtain the acrylic copolymer.

SYNTHESIS EXAMPLE 33 poly(α-gamma-butyrolactone methacrylate-co-1-ethyl-1-cyclopentylmethacrylate-co-2-cyano-5-norbornyl methacrylate)

Synthesis Example 32 can be repeated except that the molar feed ratio is changed from 30/40/30 to 40/40/20.

SYNTHESIS EXAMPLE 34 poly(β-gamma-butyrolactone methacrylate-co-1-ethyl-1-cyclopentylmethacrylate-co-2-cyano-5-norbornyl methacrylate)

Synthesis Example 32 can be repeated except that α-gamma-butyrolactone methacrylate is substituted for β-gamma-butyrolactone methacrylate.

SYNTHESIS EXAMPLE 35 poly(β-gamma-butyrolactone methacrylate-co-1-ethyl-1-cyclopentylmethacrylate-co-2-cyano-5-norbornyl methacrylate)

Synthesis Example 34 can be repeated except that the molar feed ratio is changed from 30/40/30 to 40/40/20.

SYNTHESIS EXAMPLE 36 poly(α-gamma-butyrolactone methacrylate-co-2-ethyl-2-adamantyl methacrylate-co-1-ethyl-1-cyclopentylmethacrylate-co-2-cyano-5-norbornyl methacrylate)

Into a reaction vessel equipped with an agitator, a thermometer, a reflux condenser, tube for introducing nitrogen gas can be introduced propylene glycol monomethyl ether acetate, azobismethylbutyronitrile as the initiator, 1-octathiol as the chain transfer agent and the following monomers: α-gamma-butyrolactone methacrylate, 2-ethyl-2-adamantyl methacrylate, 1-ethyl-1-cyclopentylmethacrylate, and 2-cyano-5-norbornyl methacrylate (in a molar feed ratio of 40/20/20/20). The temperature of the contents is raised under a nitrogen blanket and polymerization is conducted at 80° C. for 7 hours to obtain the acrylic copolymer.

SYNTHESIS EXAMPLE 37 poly(β-gamma-butyrolactone methacrylate-co-2-ethyl-2-adamantyl methacrylate-co-1-ethyl-1-cyclopentylmethacrylate-co-2-cyano-5-norbornyl methacrylate)

Synthesis Example 36 is repeated except that β-gamma-butyrolactone methacrylate is substituted for α-gamma-butyrolactone methacrylate, yielding poly(β-gamma-butyrolactone methacrylate-co-2-ethyl-2-adamantyl methacrylate-co-1-ethyl-1-cyclopentylmethacrylate-co-2-cyano-5-norbornyl methacrylate).

SYNTHESIS EXAMPLE 38 poly(α-gamma-butyrolactone methacrylate-co-1-ethyl-1-cyclopentylmethacrylate-co-4-isopropyl-1-methyl-5-methacrylate-co-1ethyl -bicyclo[2.2.2]octanecarbolactone)

Synthesis Example 32 is repeated except that 4-isopropyl-1-methyl-5-methacryloyloxy-2,6-bicyclo[2.2.2]octanecarbolactone is substituted for 2-cyano-5-norbornyl methacrylate, yielding poly(α-gamma-butyrolactone methacrylate-co-1-ethyl -1-cyclopentylmethacrylate-co-4-isopropyl-1-methyl-5-methacryloyloxy-2,6-bicyclo[2.2.2]octanecarbolactone)

SYNTHESIS EXAMPLE 39 poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone)

Synthesis Example 38 is repeated except that β-gamma-butyrolactone methacrylate is substituted for α-gamma-butyrolactone methacrylate, yielding poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone).

SYNTHESIS EXAMPLE 40 poly(α-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone)

Synthesis Example 36 is repeated except that 4-isopropyl-1-methyl-5-methacryloyloxy-2,6-bicyclo[2.2.2]octanecarbolactone is substituted for 2-cyano-5-norbornyl methacrylate, yielding poly(α-gamma-butyrolactone methacrylate-co-2-ethyl -2-adamantyl methacrylate-co-1-ethyl-1-cyclopentylmethacrylate-co-4-isopropyl-1-methyl-5-methacryloyloxy-2,6-bicyclo[2.2.2]octanecarbolactone).

SYNTHESIS EXAMPLE 41 poly(β-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone)

Synthesis Example 40 is repeated except that β-gamma-butyrolactone methacrylate is substituted for α-gamma-butyrolactone methacrylate, yielding poly(β-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone)

SYNTHESIS EXAMPLE 42 poly(α-gamma-butyrolactone methacrylate-co-1-ethyl-1-cyclopentyl methacrylate-co-4-isopropyl-1-methyl-5-methoxy-6-methacryloyloxy-3,2-bicyclo[2.2.2]octanecarbolactone)

Synthesis Example 32 is repeated except that 4-isopropyl-1-methyl-5-methoxy-6-methacryloyloxy-3,2-bicyclo[2.2.2]octanecarbolactone is substituted for 2-cyano-5-norbornyl methacrylate, yielding poly(α-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone).

SYNTHESIS EXAMPLE 43 poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone)

Synthesis Example 42 is repeated except that β-gamma-butyrolactone methacrylate is substituted for α-gamma-butyrolactone methacrylate, yielding poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone).

SYNTHESIS EXAMPLE 44 poly(α-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone)

Synthesis Example 36 is repeated except that 4-isopropyl-1-methyl-5-methoxy-6-methacryloyloxy-3,2-bicyclo[2.2.2]octanecarbolactone is substituted for 2-cyano-5-norbornyl methacrylate, yielding poly(α-gamma-butyrolactone methacrylate-co-2-ethyl -2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone).

SYNTHESIS EXAMPLE 45 poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone)

Synthesis Example 43 is repeated except that β-gamma-butyrolactone methacrylate is substituted for α-gamma-butyrolactone methacrylate, yielding poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone).

FORMULATION EXAMPLE 1

1.82 g of the copolymer from Synthesis Example 1, 0.46 g of 10 wt % 70:30 weight mixture of propylene glycol monomethyl ether acetate (PGMEA) and propylene glycol monomethyl ether (PGME) solution of triphenysulfonium nonflate, 0.44 g of 1 wt % 70:30 weight mixture of PGMEA and PGME solution of diisopropylaniline, 0.086 g of 1 wt % 70:30 weight mixture of PGMEA and PGME solution of diethanolamine, 0.03 g of 10 wt % 70:30 weight mixture of PGMEA and PGME solution of FC4430, and 10.03 g of 70:30 weight mixture of PGMEA and PGME solution were mixed into a 125 nm metal-free plastic bottle at ambient conditions. The mixture was rolled for at least 12 hours and was filtered through a 0.2 μm filter. A clear solution was formed.

FORMULATION EXAMPLE 2

Formulation Example 1 was repeated except that the copolymer from Synthesis Example 2 was substituted for Synthesis Example 1.

FORMULATION EXAMPLE 3

Formulation Example 1 was repeated except that a 50:50 weight ratio of the copolymer of Synthesis Example 1 and the copolymer of Synthesis Example 2 was substituted for Synthesis Example 1.

FORMULATION EXAMPLE 4

Formulation Example 1 was repeated except that a 30:70 weight ratio of the copolymer of Synthesis Example 1 and the copolymer of Synthesis Example 2 was substituted for Synthesis Example 1.

FORMULATION EXAMPLE 5

Formulation Example 1 was repeated except that a 70:30 weight ratio of the copolymer of Synthesis Example 1 and the copolymer of Synthesis Example 2 was substituted for Synthesis Example 1.

FORMULATION EXAMPLE 6

Formulation Example 1 can be repeated except that the copolymer from Synthesis Example 3 is substituted for Synthesis Example 1.

FORMULATION EXAMPLE 7

Formulation Example 1 can be repeated except that the copolymer from Synthesis Example 4 is substituted for Synthesis Example 1.

FORMULATION EXAMPLE 8

Formulation Example 1 can be repeated except that the copolymer from Synthesis Example 5 is substituted for Synthesis Example 1.

FORMULATION EXAMPLE 9

Formulation Example 1 can be repeated except that the copolymer from Synthesis Example 6 is substituted for Synthesis Example 1.

FORMULATION EXAMPLE 10

Formulation Example 1 can be repeated except that the copolymer from Synthesis Example 7 is substituted for Synthesis Example 1.

FORMULATION EXAMPLE 11

Formulation Example 1 can be repeated except that the copolymer from Synthesis Example 8 is substituted for Synthesis Example 1.

FORMULATION EXAMPLE 12

Formulation Example 1 can be repeated except that the copolymer from Synthesis Example 9 is substituted for Synthesis Example 1.

FORMULATION EXAMPLE 13

Formulation Example 1 can be repeated except that the copolymer from Synthesis Example 10 is substituted for Synthesis Example 1.

FORMULATION EXAMPLE 14

Formulation Example 1 can be repeated except that the copolymer from Synthesis Example 11 is substituted for Synthesis Example 1.

FORMULATION EXAMPLE 15

Formulation Example 1 can be repeated except that the copolymer from Synthesis Example 12 is substituted for Synthesis Example 1.

FORMULATION EXAMPLE 16

Formulation Example 1 can be repeated except that a 50:50 weight ratio of the copolymer of Synthesis Example 3 and the copolymer of Synthesis Example 4 is substituted for Synthesis Example 1.

FORMULATION EXAMPLE 17

Formulation Example 1 can be repeated except that a 30:70 weight ratio of the copolymer of Synthesis Example 3 and the copolymer of Synthesis Example 4 is substituted for Synthesis Example 1.

FORMULATION EXAMPLE 18

Formulation Example 1 can be repeated except that a 70:30 weight ratio of the copolymer of Synthesis Example 3 and the copolymer of Synthesis Example 4 is substituted for Synthesis Example 1.

FORMULATION EXAMPLE 19

Formulation Example 1 can be repeated except that a 50:50 weight ratio of the copolymer of Synthesis Example 5 and the copolymer of Synthesis Example 6 is substituted for Synthesis Example 1.

FORMULATION EXAMPLE 20

Formulation Example 1 can be repeated except that a 30:70 weight ratio of the copolymer of Synthesis Example 5 and the copolymer of Synthesis Example 6 is substituted for Synthesis Example 1.

FORMULATION EXAMPLE 21

Formulation Example 1 can be repeated except that a 70:30 weight ratio of the copolymer of Synthesis Example 5 and the copolymer of Synthesis Example 6 is substituted for Synthesis Example 1.

FORMULATION EXAMPLE 22

Formulation Example 1 can be repeated except that a 50:50 weight ratio of the copolymer of Synthesis Example 7 and the copolymer of Synthesis Example 8 is substituted for Synthesis Example 1.

FORMULATION EXAMPLE 23

Formulation Example 1 can be repeated except that a 30:70 weight ratio of the copolymer of Synthesis Example 7 and the copolymer of Synthesis Example 8 is substituted for Synthesis Example 1.

FORMULATION EXAMPLE 24

Formulation Example 1 can be repeated except that a 70:30 weight ratio of the copolymer of Synthesis Example 7 and the copolymer of Synthesis Example 8 is substituted for Synthesis Example 1.

FORMULATION EXAMPLE 25

Formulation Example 1 can be repeated except that a 50:50 weight ratio of the copolymer of Synthesis Example 9 and the copolymer of Synthesis Example 10 is substituted for Synthesis Example 1.

FORMULATION EXAMPLE 26

Formulation Example 1 can be repeated except that a 30:70 weight ratio of the copolymer of Synthesis Example 9 and the copolymer of Synthesis Example 10 is substituted for Synthesis Example 1.

FORMULATION EXAMPLE 27

Formulation Example 1 can be repeated except that a 70:30 weight ratio of the copolymer of Synthesis Example 9 and the copolymer of Synthesis Example 10 is substituted for Synthesis Example 1.

FORMULATION EXAMPLE 28

Formulation Example 1 can be repeated except that a 50:50 weight ratio of the copolymer of Synthesis Example 11 and the copolymer of Synthesis Example 12 is substituted for Synthesis Example 1.

FORMULATION EXAMPLE 29

Formulation Example 1 can be repeated except that a 30:70 weight ratio of the copolymer of Synthesis Example 11 and the copolymer of Synthesis Example 12 is substituted for Synthesis Example 1.

FORMULATION EXAMPLE 30

Formulation Example 1 can be repeated except that a 70:30 weight ratio of the copolymer of Synthesis Example 11 and the copolymer of Synthesis Example 12 is substituted for Synthesis Example 1.

FORMULATION EXAMPLE 31

Formulation Example 1 can be repeated except that the copolymer from Synthesis Example 13 is substituted for Synthesis Example 1.

FORMULATION EXAMPLE 32

Formulation Example 1 can be repeated except that the copolymer from Synthesis Example 14 is substituted for Synthesis Example 1.

FORMULATION EXAMPLE 33

Formulation Example 1 can be repeated except that the copolymer from Synthesis Example 15 is substituted for Synthesis Example 1.

FORMULATION EXAMPLE 34

Formulation Example 1 can be repeated except that the copolymer from Synthesis Example 16 is substituted for Synthesis Example 1.

FORMULATION EXAMPLE 35

Formulation Example 1 can be repeated except that the copolymer from Synthesis Example 17 is substituted for Synthesis Example 1.

FORMULATION EXAMPLE 36

Formulation Example 1 can be repeated except that the copolymer from Synthesis Example 18 is substituted for Synthesis Example 1.

FORMULATION EXAMPLE 37

Formulation Example 1 can be repeated except that the copolymer from Synthesis Example 19 is substituted for Synthesis Example 1.

FORMULATION EXAMPLE 38

Formulation Example 1 can be repeated except that the copolymer from Synthesis Example 20 is substituted for Synthesis Example 1.

FORMULATION EXAMPLE 39

Formulation Example 1 can be repeated except that the copolymer from Synthesis Example 21 is substituted for Synthesis Example 1.

FORMULATION EXAMPLE 40

Formulation Example 1 can be repeated except that the copolymer from Synthesis Example 22 is substituted for Synthesis Example 1.

FORMULATION EXAMPLE 41

Formulation Example 1 can be repeated except that the copolymer from Synthesis Example 23 is substituted for Synthesis Example 1.

FORMULATION EXAMPLE 42

Formulation Example 1 can be repeated except that the copolymer from Synthesis Example 24 is substituted for Synthesis Example 1.

FORMULATION EXAMPLE 43

Formulation Example 1 can be repeated except that the copolymer from Synthesis Example 25 is substituted for Synthesis Example 1.

FORMULATION EXAMPLE 44

Formulation Example 1 can be repeated except that the copolymer from Synthesis Example 26 is substituted for Synthesis Example 1.

FORMULATION EXAMPLE 45

Formulation Example 1 can be repeated except that the copolymer from Synthesis Example 27 is substituted for Synthesis Example 1.

FORMULATION EXAMPLE 46

Formulation 1 can be repeated except that the copolymer from Synthesis Example 28 is substituted for Synthesis Example 1.

FORMULATION EXAMPLE 47

Formulation 1 can be repeated except that the copolymer from Synthesis Example 29 is substituted for Synthesis Example 1.

FORMULATION EXAMPLE 48

Formulation Example 1 can be repeated except that the copolymer from Synthesis Example 30 is substituted for Synthesis Example 1.

FORMULATION EXAMPLE 49

Formulation Example 1 can be repeated except that the copolymer from Synthesis Example 31 is substituted for Synthesis Example 1.

FORMULATION EXAMPLE 50

Formulation Example 1 can be repeated except that the copolymer from Synthesis Example 32 is substituted for Synthesis Example 1.

FORMULATION EXAMPLE 51

Formulation Example 1 can be repeated except that the copolymer from Synthesis Example 33 is substituted for Synthesis Example 1.

FORMULATION EXAMPLE 52

Formulation Example 1 can be repeated except that the copolymer from Synthesis Example 34 is substituted for Synthesis Example 1.

FORMULATION EXAMPLE 53

Formulation Example 1 can be repeated except that the copolymer from Synthesis Example 35 is substituted for Synthesis Example 1.

FORMULATION EXAMPLE 54

Formulation Example 1 can be repeated except that the copolymer from Synthesis Example 36 is substituted for Synthesis Example 1.

FORMULATION EXAMPLE 55

Formulation Example 1 can be repeated except that the copolymer from Synthesis Example 37 is substituted for Synthesis Example 1.

FORMULATION EXAMPLE 56

Formulation Example 1 can be repeated except that the copolymer from Synthesis Example 38 is substituted for Synthesis Example 1.

FORMULATION EXAMPLE 57

Formulation Example 1 can be repeated except that the copolymer from Synthesis Example 39 is substituted for Synthesis Example 1.

FORMULATION EXAMPLE 58

Formulation Example 1 can be repeated except that the copolymer from Synthesis Example 40 is substituted for Synthesis Example 1.

FORMULATION EXAMPLE 59

Formulation Example 1 can be repeated except that the copolymer from Synthesis Example 41 is substituted for Synthesis Example 1.

FORMULATION EXAMPLE 60

Formulation Example 1 can be repeated except that the copolymer from Synthesis Example 42 is substituted for Synthesis Example 1.

FORMULATION EXAMPLE 61

Formulation Example 1 can be repeated except that the copolymer from Synthesis Example 43 is substituted for Synthesis Example 1.

FORMULATION EXAMPLE 62

Formulation Example 1 can be repeated except that the copolymer from Synthesis Example 44 is substituted for Synthesis Example 1.

FORMULATION EXAMPLE 63

Formulation Example 1 can be repeated except that the copolymer from Synthesis Example 45 is substituted for Synthesis Example 1.

LITHOGRAPHY EXAMPLE 1

AZ ArF-38 BARC (37 nm) was coated on a 8 inch bare silicon wafer and baked at 200° C. for 60 seconds. Formulation Example 1 was coated on the BARC film to 240 nm film thickness. The film was soft-baked at 115° C. for 60 s and then chilled at 21° C. for 20 seconds. The coated wafer was exposed using Nikon 306C with a 21 by 21 focus-energy-matrix with center dose of 75 mJ/cm$^2$, central focus of 0.0 µm, and dose step ±1.5 mJ/cm$^2$ and focus step ±0.05 µm. Post exposure bake of the coated wafer was done at 130° C. for 60 seconds. A single puddle of AZ 300 MIF for 60 seconds was employed for the wafer development.

Film thickness was measured on Nanometrics 8000. Photoresist and BARC coating, film bakes including BARC bake, resist soft bake and post exposure bake, wafer chilling, and exposed resist film development were all processed on Tel ACT 12. Top-down pictures were obtained using KLA 8100, and X-SEM picture by Hitachi 7200.

LITHOGRAPHY EXAMPLE 2

Lithography Example 1 was repeated except that Formulation Example 2 was substituted for Formulation Example 1.

LITHOGRAPHY EXAMPLE 3

Lithography Example 1 was repeated except that Formulation Example 2 was substituted for Formulation Example 3.

LITHOGRAPHY EXAMPLE 4

Lithography Example 1 was repeated except that Formulation Example 4 was substituted for Formulation Example 1.

LITHOGRAPHY EXAMPLE 5

Lithography Example 1 was repeated except that Formulation Example 5 was substituted for Formulation Example 1.

LITHOGRAPHY EXAMPLE 6

Lithography Example 1 can be repeated except that Formulation Example 6 is substituted for Formulation Example 1.

LITHOGRAPHY EXAMPLE 7

Lithography Example 1 can be repeated except that Formulation Example 7 is substituted for Formulation Example 1.

LITHOGRAPHY EXAMPLE 8

Lithography Example 1 can be repeated except that Formulation Example 8 is substituted for Formulation Example 1.

LITHOGRAPHY EXAMPLE 9

Lithography Example 1 can be repeated except that Formulation Example 9 is substituted for Formulation Example 1.

LITHOGRAPHY EXAMPLE 10

Lithography Example 1 can be repeated except that Formulation Example 10 is substituted for Formulation Example 1.

LITHOGRAPHY EXAMPLE 11

Lithography Example 1 can be repeated except that Formulation Example 11 is substituted for Formulation Example 1.

LITHOGRAPHY EXAMPLE 12

Lithography Example 1 can be repeated except that Formulation Example 12 is substituted for Formulation Example 1.

LITHOGRAPHY EXAMPLE 13

Lithography Example 1 can be repeated except that Formulation Example 13 is substituted for Formulation Example 1.

LITHOGRAPHY EXAMPLE 14

Lithography Example 1 can be repeated except that Formulation Example 14 is substituted for Formulation Example 1.

LITHOGRAPHY EXAMPLE 15

Lithography Example 1 can be repeated except that Formulation Example 15 is substituted for Formulation Example 1.

LITHOGRAPHY EXAMPLE 16

Lithography Example 1 can be repeated except that Formulation Example 16 is substituted for Formulation Example 1.

LITHOGRAPHY EXAMPLE 17

Lithography Example 1 can be repeated except that Formulation Example 17 is substituted for Formulation Example 1.

LITHOGRAPHY EXAMPLE 18

Lithography Example 1 can be repeated except that Formulation Example 18 is substituted for Formulation Example 1.

LITHOGRAPHY EXAMPLE 19

Lithography Example 1 can be repeated except that Formulation Example 19 is substituted for Formulation Example 1.

LITHOGRAPHY EXAMPLE 20

Lithography Example 1 can be repeated except that Formulation Example 20 is substituted for Formulation Example 1.

LITHOGRAPHY EXAMPLE 21

Lithography Example 1 can be repeated except that Formulation Example 21 is substituted for Formulation Example 1.

LITHOGRAPHY EXAMPLE 22

Lithography Example 1 can be repeated except that Formulation Example 22 is substituted for Formulation Example 1.

LITHOGRAPHY EXAMPLE 23

Lithography Example 1 can be repeated except that Formulation Example 23 is substituted for Formulation Example 1.

LITHOGRAPHY EXAMPLE 24

Lithography Example 1 can be repeated except that Formulation Example 24 is substituted for Formulation Example 1.

LITHOGRAPHY EXAMPLE 25

Lithography Example 1 can be repeated except that Formulation Example 25 is substituted for Formulation Example 1.

LITHOGRAPHY EXAMPLE 26

Lithography Example 1 can be repeated except that Formulation Example 26 is substituted for Formulation Example 1.

LITHOGRAPHY EXAMPLE 27

Lithography Example 1 can be repeated except that Formulation Example 27 is substituted for Formulation Example 1.

LITHOGRAPHY EXAMPLE 28

Lithography Example 1 can be repeated except that Formulation Example 28 is substituted for Formulation Example 1.

LITHOGRAPHY EXAMPLE 29

Lithography Example 1 can be repeated except that Formulation Example 29 is substituted for Formulation Example 1.

LITHOGRAPHY EXAMPLE 30

Lithography Example 1 can be repeated except that Formulation Example 30 is substituted for Formulation Example 1.

LITHOGRAPHY EXAMPLE 31

Lithography Example 1 can be repeated except that Formulation Example 31 is substituted for Formulation Example 1.

LITHOGRAPHY EXAMPLE 32

Lithography Example 1 can be repeated except that Formulation Example 32 is substituted for Formulation Example 1.

LITHOGRAPHY EXAMPLE 33

Lithography Example 1 can be repeated except that Formulation Example 33 is substituted for Formulation Example 1.

LITHOGRAPHY EXAMPLE 34

Lithography Example 1 can be repeated except that Formulation Example 34 is substituted for Formulation Example 1.

LITHOGRAPHY EXAMPLE 35

Lithography Example 1 can be repeated except that Formulation Example 35 is substituted for Formulation Example 1.

LITHOGRAPHY EXAMPLE 36

Lithography Example 1 can be repeated except that Formulation Example 36 is substituted for Formulation Example 1.

LITHOGRAPHY EXAMPLE 37

Lithography Example 1 can be repeated except that Formulation Example 37 is substituted for Formulation Example 1.

LITHOGRAPHY EXAMPLE 38

Lithography Example 1 can be repeated except that Formulation Example 38 is substituted for Formulation Example 1.

LITHOGRAPHY EXAMPLE 39

Lithography Example 1 can be repeated except that Formulation Example 39 is substituted for Formulation Example 1.

LITHOGRAPHY EXAMPLE 40

Lithography Example 1 can be repeated except that Formulation Example 40 is substituted for Formulation Example 1.

LITHOGRAPHY EXAMPLE 41

Lithography Example 1 can be repeated except that Formulation Example 41 is substituted for Formulation Example 1.

LITHOGRAPHY EXAMPLE 42

Lithography Example 1 can be repeated except that Formulation Example 42 is substituted for Formulation Example 1.

LITHOGRAPHY EXAMPLE 43

Lithography Example 1 can be repeated except that Formulation Example 43 is substituted for Formulation Example 1.

LITHOGRAPHY EXAMPLE 44

Lithography Example 1 can be repeated except that Formulation Example 44 is substituted for Formulation Example 1.

LITHOGRAPHY EXAMPLE 45

Lithography Example 1 can be repeated except that Formulation Example 45 is substituted for Formulation Example 1.

LITHOGRAPHY EXAMPLE 46

Lithography Example 1 can be repeated except that Formulation Example 46 is substituted for Formulation Example 1.

LITHOGRAPHY EXAMPLE 47

Lithography Example 1 can be repeated except that Formulation Example 47 is substituted for Formulation Example 1.

LITHOGRAPHY EXAMPLE 48

Lithography Example 1 can be repeated except that Formulation Example 48 is substituted for Formulation Example 1.

LITHOGRAPHY EXAMPLE 49

Lithography Example 1 can be repeated except that Formulation Example 49 is substituted for Formulation Example 1.

LITHOGRAPHY EXAMPLE 50

Lithography Example 1 can be repeated except that Formulation Example 50 is substituted for Formulation Example 1.

LITHOGRAPHY EXAMPLE 51

Lithography Example 1 can be repeated except that Formulation Example 51 is substituted for Formulation Example 1.

LITHOGRAPHY EXAMPLE 52

Lithography Example 1 can be repeated except that Formulation Example 52 is substituted for Formulation Example 1.

LITHOGRAPHY EXAMPLE 53

Lithography Example 1 can be repeated except that Formulation Example 53 is substituted for Formulation Example 1.

LITHOGRAPHY EXAMPLE 54

Lithography Example 1 can be repeated except that Formulation Example 54 is substituted for Formulation Example 1.

LITHOGRAPHY EXAMPLE 55

Lithography Example 1 can be repeated except that Formulation Example 55 is substituted for Formulation Example 1.

LITHOGRAPHY EXAMPLE 56

Lithography Example 1 can be repeated except that Formulation Example 56 is substituted for Formulation Example 1.

LITHOGRAPHY EXAMPLE 57

Lithography Example 1 can be repeated except that Formulation Example 57 is substituted for Formulation Example 1.

LITHOGRAPHY EXAMPLE 58

Lithography Example 1 can be repeated except that Formulation Example 58 is substituted for Formulation Example 1.

LITHOGRAPHY EXAMPLE 59

Lithography Example 1 can be repeated except that Formulation Example 59 is substituted for Formulation Example 1.

LITHOGRAPHY EXAMPLE 60

Lithography Example 1 can be repeated except that Formulation Example 60 is substituted for Formulation Example 1.

LITHOGRAPHY EXAMPLE 61

Lithography Example 1 can be repeated except that Formulation Example 61 is substituted for Formulation Example 1.

LITHOGRAPHY EXAMPLE 62

Lithography Example 1 can be repeated except that Formulation Example 62 is substituted for Formulation Example 1.

LITHOGRAPHY EXAMPLE 63

Lithography Example 1 can be repeated except that Formulation Example 63 is substituted for Formulation Example 1.

For top down depth of focus, Formulation Examples 1, 2, and 3 were equivalent, Formulation Example 4 was slightly worse than Formulations 1, 2, and 3 and Formulation Example 5 was better than Formulations 1, 2, and 3.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:

1. A photoresist composition oomprising a polymer mixture comprising a copolymer (A) containing a α-gamma-butyrolactone methacrylate monomer unit and a copolymner (B) containing a β-gamma-butyrolactone methacrylate monomer unit wherein copolymner (A) comprises the monomer units α-gamma-butyrolactone methacrylate, 2-methyl-2-adamantyl methacrylate, and 2-cyano-5-norbornyl methacrylate.

2. The photoresist composition of claim 1 wherein copolymer (B) comprises the monomer units β-gamma-butyrolactone methacrylate, 2-methyl-2-adamantyl methacrylate, and 2-cyano-5-norbomyl methacrylate.

3. A process for imaging a photoresist comprising the steps of:
   a) coating a substrate with the photoresist composition of claim 1;
   b) baking the substrate to substantially remove the solvent;
   c) image-wise exposing the photoresist coating;
   d) post-exposure baking the photoresist coating; and
   e) developing the photoresist coating with an aqueous alkaline solution.

4. The process according to claim 3 wherein copolymer (B) comprises the monomer units β-gamma-butyrolactone methacrylate, 2-methyl-2-adamantyl methacrylate, and 2-cyano-5-norbornyl methacrylate.

5. A method for producing a microelectronic device by forming an image on a substrate comprising:
   a) providing a photoresist composition of claim 1;
   b) coating a suitable substrate with the photoresist composition of step a); and
   c) heat treating the coated substrate of step b) until substantially all of the phtotoresist solvent is removed; image-wise exposing the photoresist composition and removing the image-wise exposed areas of such composition with a suitable developer.

6. A photoresist composition comprising a polymer mixture comprising a copolymer (A) containing a α-gamma-butyrolactone methacrylate monomer unit and a copolymer (B) containing a β-gamma-butyrolactone methacrylate monomer unit wherein the ratio of copolymers (A) and (B) is from about 90:10 weight percent to about 10:90 weight percent wherein copolymer (A) comprises the monomer units α-gamma-butyrolactone methacrylate, 2-methyl-2-adamantyl methacrylate, and 2-cyano-5-norbornyl methacrylate.

7. The photoresist composition of claim 6 wherein copolymer (B) comprises the monomer units β-gamma-butyrolactone methacrylate, 2-methyl-2-adamantyl methacrylate, and 2-cyano-5-norbornyl methacrylate.

8. A process for imaging a photoresist comprising the steps of:
   a) a coating a substrate with the photoresist composition of claim 6;
   b) baking the substrate to substantially remove the solvent;
   c) image-wise exposing the photoresist coating;
   d) post-exposure baking the photoresist coating; and
   e) developing the photoresist coating with an aqueous alkaline solution.

9. The process according to claim 8 wherein copolymer (B) comprises the monomer units β-gamma-butyrolactone methacrylate, 2-methyl-2-adamantyl methacrylate, and 2-cyano-5-norbornyl methacrylate.

10. A method for producing a microelectronic device by forming an image on a substrate comprising:
    a) providing a photoresist composition of claim 6;
    b) coating a suitable substrate with the photoresist composition of step a); and
    c) heat treating the coated substrate of step b) until substantially all of the photoresist solvent is removed; image-wise exposing the photoresist composition and removing the image-wise exposed areas of such composition with a suitable developer.

11. A photoresist composition comprising a polymer selected from the group consisting of poly(2-methyl-2-adamantyl methacrylate-co-α-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-α-gamma-butyrolactone methacrylate-co-4-isopropy-1-methyl-5-methacryloyloxy-2,6-bicyclo[2.2.2]octanecarbolactone); poly(2-methyl-2adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2bicyclo[2.2.2]octanecarbolactone); poly(2-ethyl-2-adamantyl methacrylate-co-α-gamma-butyrolactone methacrylate-co-2-cyano-5-norbornyl methacrylate); poly(2-ethyl-2-adamantyl methacrylate-co-α-gammna-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bicyolo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-2-ethyl-2-adamantyl methacrylate-co-2-cyano-5-norbornyl methacrylate); poly(2-methyl-2-adamantyl methacrylate-co-3-hydroxy-1-methacryloxyadamantane-co-2-cyano-5-norbornyl methacrylate); poly(t-butyl norbornene carboxylate-co-maleic anhydride-co-2-methyl-2-adamantyl methacrylate-co-2-cyano-5-norbornyl methacrylate-co-5-methacryloyloxy-2,6-norbornanecarbolactone); poly(2-methyl-2-adamantyl methacrylate-co-5-methacryloyloxy-2,6-norbornanecarbolactone-co-2-cyano-5-norbornyl methacrylate); poly(2-methyl-2-adamantyl methacrylate-co-2-ethyl-2-adamantyl methacrylate-co-4-isopropyl-1-methyl-5-methacryloyloxy-2,6bicyclo[2.2.2]octanecarbolactone); poly(2-methyl-2-adamantyl methacrylate-co-3-hydroxy-1-methacryloxyadamantane-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-α-gamma-butyrolactone methacrylate-co-4-isopropyl-1-methyl-5-methacryloyloxy-2,6-bicyclo[2 2.2]octanecarbolactone); poly(t-butyl norbornene carboxylate-co-maleic anhydride-co-2-methyl-2-adamantyl methacrylate-co-4-isopropyl-1-methyl-5-methacryloyloxy -2,6-bicyclo[2.2.2]octanecarbolactone-co-5methacryloyloxy-2,6-norbornanecarbolactone); poly(2-methyl-2-adamantyl methacrylate-co-5-methacryloyloxy-2,6-norbornanecarbolactone-co-4-isopropyl-1-methyl-5-methacryloyloxy-2,6-bicyclo[2.2.2]octanecarbolactone); poly(2-methyl-2-adamantyl methacrylate-co-2-ethyl-2-adamantyl methacrylate-co-4-isopropyl-1-methyl-5-methoxy-6-methacryloyloxy-3,2-bicyolo[2.2.2]octanecarbolactone); poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone-co-5-methacryloyloxy-2,6-norbornanecarbolactone); poly(α-gamma-butyrolactone methacrylate-co-1-ethyl-1-cyclopentylmethacrylate-co-2-cyano-5-norbornyl methacrylate); poly(α-gamma-butyrolactone methacrylate-co-2-ethyl-2-adamantyl methacrylate-co-1-ethyl-1-cyclopentylmethacrylate-co-2-cyano-5-norbornyl methacrylate); poly(β-gamma-butyrolactone methacrylate-co-2-ethyl-2-adamantyl methacrylate-co-1-ethyl-1-cyclopentylmethacrylate-co-2-cyano-5-norbornyl methacrylate); poly(α-gamma-butyrolactone methacrylate-co-1-ethyl-1-cyclopentylmethacrylate-co-4isopropyl-1-methyl-5-methacryloyloxy-2,6-bicyclo[2.2.2]octanecarbolactone); poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-2-ethyl-2adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-2-ethyl-2-adamantyl methacrylate-co-1-ethyl-1-cyclopentylmethacrylate-co-4-isopropyl-1-methyl-5-methoxy-6-methacryloyloxy-3,2-bicyclo[2.2.2]octanecarbolactone); and poly(2-methyl-2-adamantyl methacrylate-co-5-methacryloyloxy-2,6-norbornanecarbolactone-co-4-isopropyl-1-methyl-5-methoxy-6-methacryloyloxy-3,2-bicyclo[2.2.2]octanecarbolactone).

12. The photoresist composition of claim 11 wherein the polymer is selected from the group consisting of poly(2-methyl-2-adamantyl methacrylate-co-α-gamma-butyrolactone methacrylate-co-β-gamma-butyrolactone methacrylate-co-2-cyano-5-norbornyl methacrylate); poly(2-methyl-2-adamantyl methacrylate-co-α-gamma-butyrolactone methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-α-gamma-butyrolactone methacrylate-co-4-isopropyl-1-methyl-5-methacryloyloxy-2,6-bicyclo[2 2.2]octanecarbolactone); poly(2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(2-methyl-2-adamantyl methacrylate-co-α-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolaotone); poly(2-ethyl-2-adamantyl methacrylate-co-β-gamma-butyrolactone methacrylate-co-2-cyano-5-norbornyl methacrylate); poly(2-ethyl-2-adamantyl methacrylate-co-α-gamma-butyrolactone methacrylate-co-4-isopropyl-1-methyl-5-methacryloyloxy-2,6-bicyclo[2.2.2]octanecarbolactone); poly(2-ethyl-2-adamantyl methacrylate-co-β-gamma-butyrolactone methacrylate-co-4-isopropyl-1-methyl-5-methacryloyloxy-2,6-bioyclo[2.2.2]octanecarbolactone); poly(2-ethyl-2-adamantyl methacrylate-co-α-gamma-butyrolactone methacrylate-co-4-isopropyl-1-methyl-5-methoxy-6-methacryloyloxy-3,2-bioyclo[2.2.2]octanecarbolactone); poly(2-ethyl-2-adamantyl methacrylate-co-β-gamma-butyrolactone methacrylate-co-4-isopropyl-1-methyl-5-methoxy-6-methacryloyloxy-3,2-bicyclo[2.2.2]octanecarbolactone); poly(2-methyl-2-adamantyl methacrylate-co-2-ethyl-2-adamantyl methacrylate-co-2-cyano-5-norbornyl methacrylate); poly(2-methyl-2-adamantyl methacrylate-co-3-hydroxy-1-methacryloxyadamantane-co-2-cyano-5-norbornyl methacrylate); poly(t-butyl norbornene carboxylate-co-maleic anhydride-co-2-methyl-2-adamantyl methacrylate-co-2-cyano-5-norbornyl methacrylate-co-5-methacryloyloxy-2,6-norbornanecarbolactone); poly(2-methyl-2-adamantyl methacrylate-co-5-methacryloyloxy-2,6-norbornanecarbolactone-co-2-cyano-5-norbornyl methacrylate); poly(2-methyl-2-adamantyl methacrylate-co-2-ethyl-2-adamantyl methacrylate-co-4-isopropyl-1-methyl-5-methacryloyloxy-2,6-bicyclo[2.2.2]octanecarbolactone); poly(2-methyl-2adamantyl methacrylate-co-3-hydroxy-1-methacryloxyadamantane-co-4-isopropyl-1-methyl-5-methacryloyloxy-2,6bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4-isopropyl-1-methyl-5-methacryloyloxy-2,6-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methacryloyloxy-2,6-bicyclo[2.2.2]octanecarbolactone-co-5-methacryloyloxy-2,6-norbornanecarbolactone); poly(2-methyl-2-adamantyl methacrylate-co-5-methacryloyloxy-2,6-norbornanecarbolactone-co-4-isopropyl-1-methyl-5-methacryloyloxy-2,6-bicyclo[2.2.2]octanecarbolactone); poly(2-methyl-2-adamantyl methacrylate-co-2-ethyl-2-adamantyl methacrylate-co-4-isopropyl-1-methyl-5-methoxy-6-methacryloyloxy-3,2-bicyclo[2.2.2]octanecarbolactone); poly(2-methyl-2-adamantyl methacrylate-co-3-hydroxy-1-methacryloxyadamantane-co-4-isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-β-gamma-butyrolactone methacrylate-co-4isopropyl-1-methyl-5-methoxy-6-methacryloyloxy-3,2-bicyclo[2.2.2]octanecarbolactone); poly(t-butyl norbornene carboxylate-co-maleic anhydride-co-2-methyl-2-adamantyl methacrylate-co-4-isopropyl-1-methyl-5-methoxy-6-methacryloyloxy-3,2-bicyclo[2.2.2]octanecarbolactone-co-5-methacryloyloxy-2,6-norbornanecarbolactone); poly(α-gamma-butyrolactone methacrylate-co-1-ethyl-1-cyolopentylmethacrylate-co-2-cyano-5-norbornyl methacrylate); poly(β-gamma-butyrolactone methacrylate-co-1-ethyl-1-cyclopentylmethacrylate-co-2-cyano-5-norbornyl methacrylate); poly(β-gamma-butyrolactone methacrylate-co-2-ethyl-2-adamantyl methacrylate-co-1-ethyl-1-cyclopentylmethacrylate-co-2-cyano-5-norbornyl methacrylate); poly(α-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(β-gamma-butyrolactone methacrylate-co-1-ethyl-1-cyclopentylmethacrylate-co-4-isopropyl-1-methyl-5-methacryloyloxy-2,6-bicyclo[2.2.2]octanecarbolactone); poly(α-gamma-butyrolactone methacrylate-co-2-ethyl-2-adamantyl methacrylate-co-1-ethyl-1-cyclopentylmethacrylate-co-4-isopropyl-1methyl-5methacryloyloxy-2,6-bicyclo[2.2.2]octanecarbolactone); poly(β-gamma-butyrolactone methacrylate-co-2-ethyl-2-adamantyl methacrylate-co-1-ethyl-1-cycopentylmethacrylate-co-4-isopropyl-1-methyl-5-methacryloyloxy-2,6-bicyclo[2.2.2]octanecarbolactone); poly(α-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-1-ethyl-1-cyclopentylmethacrylate-co-4-isopropyl-1-methyl-5-methoxy-6-methacryloyloxy-3,2-bicyclo[2.2.2]octanecarbolactone); poly(α-gamma-butyrolactone methacrylate-co-2-ethyl-2-adamantyl methacrylate-co-1- ethyl-1-cyclopentylmethacrylate-co-4-isopropyl-1-methyl-5-methoxy-6-methacryloyloxy-3,2-bicyclo[2.2.2]octanecarbolactone); poly(β-gamma-butyrolactone methacrylate-co-2-ethyl-2-adamantyl methacrylate-co-1-ethyl-1-cyolopentylmethacrylate-co-4-isopropyl-1-methyl-5-methoxy-6-methacryloyloxy-3,2-bicyclo[2.2.2] octanecarbolactone); and poly(2-methyl-2-adamantyl methacrylate-co-5-methacryloyloxy-2,6-norbornanecarbolactone-co-4-isopropyl-1-methyl-5-methoxy-6-methacryloyloxy-3,2-bioyclo[2.2.2]octanecarbolactone).

* * * * *